(12) United States Patent
Toguri et al.

(10) Patent No.: US 8,311,816 B2
(45) Date of Patent: Nov. 13, 2012

(54) NOISE SHAPING FOR PREDICTIVE AUDIO CODING APPARATUS

(75) Inventors: Yasuhiro Toguri, Kanagawa (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 292 days.

(21) Appl. No.: 12/639,676

(22) Filed: Dec. 16, 2009

(65) Prior Publication Data

US 2010/0153121 A1 Jun. 17, 2010

(30) Foreign Application Priority Data

Dec. 17, 2008 (JP) ................................ P2008-320779

(51) Int. Cl.
*G10L 21/02* (2006.01)
*G10L 19/00* (2006.01)

(52) U.S. Cl. ..................... 704/226; 704/200.1; 704/219; 704/230

(58) Field of Classification Search ............... 704/200.1, 704/219, 226, 230, E19.014, 15, 23, 24
See application file for complete search history.

(56) References Cited

U.S. PATENT DOCUMENTS

| | | | | |
|---|---|---|---|---|
| 4,969,192 | A * | 11/1990 | Chen et al. ............... | 704/222 |
| 5,890,108 | A * | 3/1999 | Yeldener ............... | 704/208 |
| 6,044,338 | A * | 3/2000 | Akune ............... | 704/219 |
| 6,996,523 | B1 * | 2/2006 | Bhaskar et al. ............... | 704/222 |
| 7,512,535 | B2 * | 3/2009 | Chen et al. ............... | 704/228 |
| 7,707,034 | B2 * | 4/2010 | Sun et al. ............... | 704/262 |
| 2003/0135365 | A1 * | 7/2003 | Thyssen et al. ............... | 704/228 |
| 2006/0129389 | A1 * | 6/2006 | Den Brinker et al. ............... | 704/219 |

FOREIGN PATENT DOCUMENTS

| | | |
|---|---|---|
| JP | 57-062096 | 4/1982 |
| JP | 01-221021 | 9/1989 |
| JP | 01-261930 | 10/1989 |
| JP | 02-309820 | 12/1990 |
| JP | 2007-6317 | 1/2007 |

OTHER PUBLICATIONS

Notification of Reasons for Refusal, issued Oct. 26, 2010 with English language translation from the Japanese Patent Office in corresponding Japanese Patent Application No. 2008-320779.

* cited by examiner

*Primary Examiner* — Jesse Pullias
(74) *Attorney, Agent, or Firm* — Finnegan, Henderson, Farabow, Garrett & Dunner, LLP

(57) ABSTRACT

An information coding apparatus includes a predictive signal generator that generates a predictive signal; a predictive residual signal generator that generates a predictive residual signal; a quantizer that quantizes a quantization input signal generated based on the predictive residual signal; a quantization error signal generator that generates a quantization error signal; a feedback signal generator that generates a feedback signal for controlling the frequency characteristic of the quantization noise after decoding based on the quantization error signal; and a quantization input signal generator that generates the quantization input signal. The feedback signal generator is configured by a pole-zero filter that includes a filter coefficient of an all-pole filter which is based on spectral envelope information estimated by the input audio signal, a parameter for adjusting a peak level in the frequency characteristic of the quantization noise caused by the all-pole filter, and the predictive filter coefficient.

11 Claims, 15 Drawing Sheets

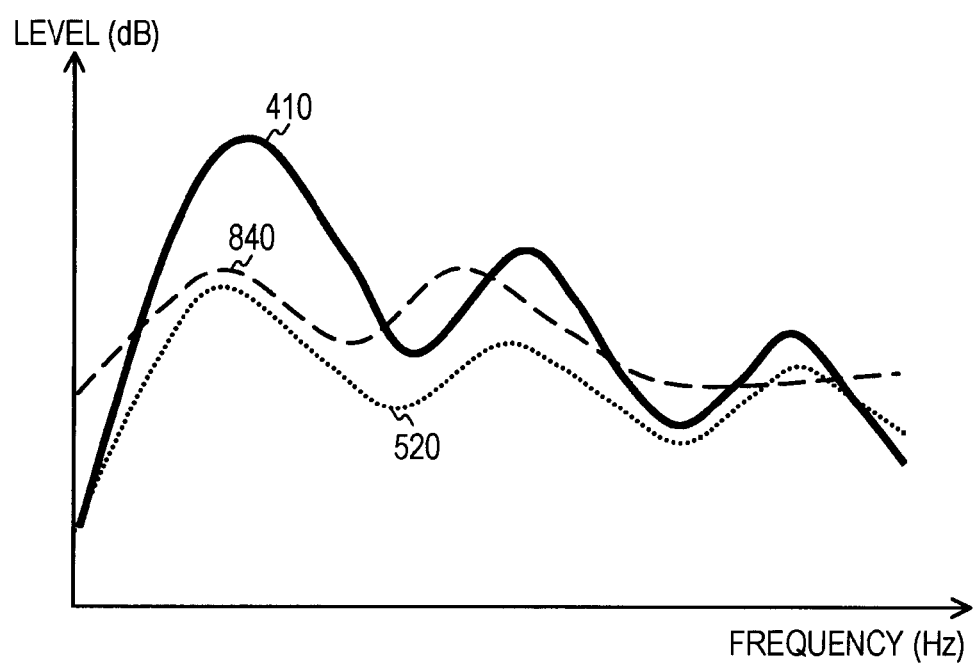

NOISE SHAPING FOR PREDICTIVE AUDIO CODING APPARATUS

BACKGROUND OF THE INVENTION

1. Field of the Invention

The present invention relates to an information coding apparatus, and more particularly, to an information coding apparatus that quantizes difference data between an input audio signal and a predicted audio signal.

2. Description of the Related Art

In the related art, adaptive differential PCM (ADPCM: Adaptive Differential Pulse Code Modulation) is one of the known time-domain waveform coding methods. In addition to this, other waveform coding methods such as adaptive predictive coding (APC) are known. In many cases, these coding methods such as ADPCM or APC are used in combination with a noise shaping technique. The noise shaping technique as used herein refers to a technique that modulates the frequency characteristic of the quantization noise after decoding by feeding back quantization errors so as to obtain the auditory masking effects. A brief description of an example of the ADPCM method combining the noise shaping technique and the coding method will be provided below.

FIGS. 13A and 13B are block diagrams showing one exemplary configuration of an audio transmission system based on ADPCM methods according to the related art. Specifically, FIGS. 13A and 13B, respectively, show an audio coding apparatus that codes an input audio signal X(z) to output a quantized signal Xq(z), and an audio decoding apparatus that decodes the quantized signal Xq(z).

FIG. 13A is a block diagram showing one exemplary configuration of an audio coding apparatus 700 based on ADPCM methods according to the related art. The audio coding apparatus 700 is configured to receive an input audio signal X(z) of each frame from a signal line 701 and output a quantized signal Xq(z) from a signal line 709. The frame as used therein refers to a predetermined number of the sample values of sampled discrete time signals.

The audio coding apparatus 700 includes a predictive filter P(z) 710, subtractors 720 and 730, a quantizer 740, a subtractor 750, and a feedback calculator R(z) 760.

The predictive filter P(z) 710 is configured to predict the present audio signal based on the past audio signal in the input audio signal X(z) and predictive filter coefficients for generating predictive signals. The predictive filter P(z) 710 predicts the present sample values by performing a product-sum operation on the past sample values and the predictive filter coefficients. That is to say, the predictive filter P(z) 710 generates the predictive signals based on Equation 1.

$$P(z) = \sum_{i=1}^{Np} p_i z^{-i} \quad \text{Equation 1}$$

In this equation, P(z) is a predictive filter based on an all-pole model of the input audio signal X(z). $p_i$ is the predictive filter coefficient for generating the predictive signals. The predictive filter coefficient $p_i$ can be calculated by linear predictive coding (LPC) analysis on the input audio signal X(z), for example. The LPC analysis as used herein is a method of estimating the frequency characteristic of the input audio signal by using the proximity correlation between audio samples. That is, the LPC analysis is a method of estimating the coefficient of a filter approximating the characteristics of a vocal tract in a voice generation model from the input audio signal. Np is the order of the predictive filter P(z).

The predictive filter P(z) 710 outputs the generated predictive signals to the subtractor 720.

The subtractor 720 is configured to calculate a difference between the present audio signal supplied from the signal line 701 and the predictive signal supplied from the predictive filter P(z) 710. The subtractor 720 generates a predictive residual signal by subtracting the predictive signal supplied from the predictive filter P(z) 710 from the present audio signal supplied from the signal line 701. The subtractor 720 outputs the generated predictive residual signal to the subtractor 730.

The subtractor 730 is configured to feed back the output of the feedback calculator R(z) 760 to the predictive residual signal supplied from the subtractor 720. The subtractor 730 calculates a difference between the predictive residual signal output from the subtractor 720 and the output of the feedback calculator R(z) 760. The subtractor 730 generates a modified predictive residual signal by subtracting the output of the feedback calculator R(z) 760 from the predictive residual signal output from the subtractor 720. The subtractor 730 outputs the generated modified predictive residual signal to the quantizer 740 and the subtractor 750.

The quantizer 740 is configured to quantize the modified predictive residual signal generated by the subtractor 730 into a predetermined number of bits. The quantizer 740 outputs the quantized signal Xq(z) to the signal line 709 and the subtractor 750.

The subtractor 750 is configured to calculate a difference between the modified predictive residual signal generated by the subtractor 730 and the quantized signal Xq(z) quantized by the quantizer 740. The subtractor 750 generates a quantization error signal E(z) by subtracting the modified predictive residual signal generated by the subtractor 730 from the quantized signal Xq(z) quantized by the quantizer 740. The subtractor 750 outputs the generated quantization error signal E(z) to the feedback calculator R(z) 760.

The feedback calculator R(z) 760 is a noise shaping filter that generates a feedback signal Es(z) for controlling the frequency characteristic of the quantization noise after decoding based on the quantization error signal E(z) from the subtractor 750. The feedback calculator R(z) 760 is configured based on the predictive filter P(z) 710. That is to say, the feedback calculator R(z) 760 performs arithmetic processing based on Equation 2 to generate the processing results as the feedback signal Es(z).

$$R(z) = P(\lambda^{-1} z) = \sum_{i=1}^{Np} \lambda^i p_i z^{-i} \quad \text{Equation 2}$$

In this equation, λ is an adjustment parameter for adjusting the peak level in the frequency characteristic of the quantization noise after decoding.

The feedback calculator R(z) 760 supplies the generated feedback signal Es(z) to the subtractor 730.

As described above, the feedback calculator R(z) 760 of the audio coding apparatus 700 is configured based on the predictive filter P(z) 710.

FIG. 13B is a block diagram showing one exemplary configuration of an audio decoding apparatus 1 that decodes the quantized signal Xq(z) output from the audio coding apparatus 700. The audio decoding apparatus 800 includes an adder 810 and a predictive filter P(z) 820.

The adder 810 is configured to add the quantized signal Xq(z) supplied via the signal line 801 and the output of the predictive filter P(z) 820. The adder 810 generates a decoded signal Y(z) by adding the quantized signal Xq(z) and the output of the predictive filter P(z) 820. The adder 810 outputs the generated decoded signal Y(z) to a signal line 809 and a predictive filter P(z) 820.

The predictive filter P(z) 820 is configured to perform arithmetic processing on the decoded signal Y(z) output from the adder 810. The predictive filter P(z) 820 has the same configuration as the predictive filter P(z) 710 of the audio coding apparatus 700. That is to say, the predictive filter P(z) 820 uses the same predictive filter coefficient $p_i$ as used by the predictive filter P(z) 710. Moreover, the predictive filter P(z) 820 performs arithmetic processing based on Equation 1 and supplies the processing results to the adder 810.

As described above, the audio decoding apparatus 800 decodes the quantized signal Xq(z) by using only the adder 810 and the predictive filter P(z) 820 having the same configuration as that of the audio coding apparatus 700. Therefore, it can be understood that the configuration of the audio decoding apparatus 800 is not affected by the configuration of the feedback calculator R(z) 760.

Next, the characteristic of the quantization noise included in the decoded signal Y(z) which is output from the audio decoding apparatus 800 will be described.

First, the characteristic of the quantized signal Xq(z) output from the audio coding apparatus 700 can be expressed by the following equation in which E(z) represents the quantization error in the audio coding apparatus 700.

$$Xq(z) = [1 - P(z)] \cdot X(z) + E(z) - Es(z)$$
$$= [1 - P(z)] \cdot X(z) + [1 - R(z)] \cdot E(z)$$

The characteristic of the decoded signal Y(z) output from the audio decoding apparatus 800 can be expressed by Equation 3 based on the above equation.

$$Y(z) = \frac{1}{1 - P(z)} \cdot Xq(z) = X(z) + \frac{1 - R(z)}{1 - P(z)} \cdot E(z) \quad \text{Equation 3}$$

It can be understood from the above equation that the quantization noise characteristic of the decoded signal Y(z) output from the audio decoding apparatus 800 can be controlled by P(z) and R(z). The frequency characteristic of the quantization noise output from the audio decoding apparatus 800 in the case of P(z)=R(z) will be described.

FIG. 14 is a diagram showing an example of the quantization noise output from the audio decoding apparatus 800 in the case of P(z)=R(z). In the drawing, the frequency characteristic of the input audio signal is represented by the solid line 780, and the frequency characteristic of the quantization noise is represented by the broken line 881. The horizontal axis represents frequency and the vertical axis represents intensity.

The frequency characteristic 780 of the input audio signal is the frequency characteristic of the audio signal input to the audio coding apparatus 700. The waveform of the frequency characteristic 780 of the input audio signal has three peaks (poles), and the peak level decreases as the frequency decreases.

The frequency characteristic 881 of the quantization noise is the frequency characteristic of the quantization noise included in the decoded signal Y(z) when the input audio signal coded by the audio coding apparatus 700 is decoded by the audio decoding apparatus 800.

As described above, in the case of P(z)=R(z), the quantization noise shows a flat frequency characteristic regardless of the frequency characteristic 780 of the input audio signal. In this case, the S/N which is the ratio of the level of the input audio signal (Signal) to the level of the quantization noise (Noise) will be poor in the valley portions of the input audio signal waveform, and thus annoying noise is likely to be heard. Therefore, it is important to match the frequency characteristic of the quantization noise to the waveform of the frequency characteristic of the input audio signal, thus reducing the auditory noise by the auditory masking effects. An example of the frequency characteristic of the quantization noise modulated by the feedback calculator R(z) 760 of the audio coding apparatus 700 will be described below.

FIG. 15 is a diagram showing an example of the frequency characteristic of the quantization noise modulated by the feedback calculator R(z) 760 of the audio coding apparatus 700. In the drawing, the frequency characteristic of the input audio signal is represented by the solid line 780, and the frequency characteristic of the quantization noise is represented by the broken lines 882 to 884. The horizontal axis represents frequency and the vertical axis represents intensity. The frequency characteristic 780 of the input audio signal has the same characteristic as that in FIG. 14 and thus will not be described herein.

The frequency characteristics 882 to 884 of the quantization noise are the frequency characteristics of the quantization noise after decoding when the adjustment parameter λ of the feedback calculator R(z) 760 was set to "0.0," "0.5," and "1.0," respectively. The frequency characteristic 884 of the quantization noise when the adjustment parameter λ is set to "1.0," namely P(z)=R(z), shows the same flat frequency characteristic as the frequency characteristic 881 of the quantization noise shown in FIG. 14.

As described above, the peak level in the frequency characteristic of the quantization noise can be adjusted by decreasing the value of the adjustment parameter λ of the feedback calculator R(z) 760. That is to say, it is preferable to decrease the adjustment parameter λ as much as possible to obtain the auditory masking effects. However, if the adjustment parameter λ is too small, the level of the feedback signal Es(z) generated by the feedback calculator R(z) 760 will become too high. In such a case, signals at levels exceeding the quantization range will be input to the quantizer 740, and thus the decoded signals will produce an unnatural sound. For this reason, the adjustment parameter λ is typically set to a range of "0.4" to "0.8." When the signals at levels exceeding the quantization range are input to the quantizer, whereby the quantized signals of the quantizer are saturated, those input signals are referred to as having been clipped.

Therefore, in order to appropriately control the quantization noise after decoding, an audio coding apparatus has been proposed in which the feedback calculator R(z) 760 is configured based on the predictive filter P(z) 710. Such a proposal is described, for example, in B. S. Atal, M. R. Schroeder: "Predictive coding of speech signals and subjective error criteria," IEEE Transactions on Acoustics, Speech and Signal Processing, vol. ASSP-27, p. 247-254, June 1979.

SUMMARY OF THE INVENTION

In the related art described above, the frequency characteristic of the quantization noise can be matched to the waveform of the frequency characteristic of the input audio signal by configuring the feedback calculator based on the predictive filter. In this case, it is necessary to sufficiently increase the order Np of the predictive filter in order to match the frequency characteristic of the quantization noise to the complex waveform of the frequency characteristic of the input audio signal. For example, when the sampling frequency is 48 kHz, the order Np should be set to "32" or higher.

However, when the order Np of the predictive filter is increased, the order of the predictive filter in the audio decoding apparatus has to be increased, which results in an increase in the calculation load of the audio decoding apparatus. Therefore, the order Np is generally set as low as "1" to "16." Moreover, in some cases, in order to decrease the transmission bit rate, the patterns of a plurality of predetermined predictive filters are stored in the audio decoding apparatus as a table, and the index corresponding to the pattern of a predictive filter is transmitted rather than transmitting the predictive filter coefficient of that predictive filter. In such a case, it is difficult to match the frequency characteristic of the quantization noise to the waveform of the frequency characteristic of the input audio signal.

FIG. 16 is a diagram showing an example of the frequency characteristic of the quantization noise when the order of a predictive filter is low and the number of patterns of the predictive filter is small. In the drawing, the frequency characteristic of the input audio signal is represented by the solid line 780, and the frequency characteristic of the quantization noise is represented by the dotted line 885. The horizontal axis represents frequency and the vertical axis represents intensity. The frequency characteristic 780 of the input audio signal has the same characteristic as that in FIG. 14 and thus will not be described herein.

The frequency characteristic 885 of the quantization noise is the frequency characteristic of the quantization noise output from the audio decoding apparatus when the order of a predictive filter is low and the number of patterns of the predictive filter is small. The frequency characteristic 885 of the quantization noise has a different waveform with two peak levels (poles) smaller than the waveform of the frequency characteristic 780 of the input audio signal.

Therefore, when a low-order predictive filter having limited patterns such as this is used, it may be difficult to match the waveform of the frequency characteristic 885 of the quantization noise to the waveform of the frequency characteristic 780 of the input audio signal. On the contrary, in this case, the valley portions of the waveform of the frequency characteristic 780 of the input audio signal may increase the quantization noise, thus increasing the auditory noise.

Therefore, it is desirable to appropriately control the frequency characteristic of the quantization noise after decoding.

According to an embodiment of the present invention, an information coding apparatus includes a predictive signal generator that generates a predictive signal based on a past audio signal in an input audio signal and a predictive filter coefficient for predicting a present audio signal; a predictive residual signal generator that generates a difference between the present audio signal and the predictive signal as a predictive residual signal; a quantizer that quantizes a quantization input signal generated based on the predictive residual signal to generate a quantization output signal; a quantization error signal generator that generates a difference between the quantization input signal and the quantization output signal as a quantization error signal; a feedback signal generator that generates a feedback signal for controlling the frequency characteristic of the quantization noise after decoding based on the quantization error signal; and a quantization input signal generator that generates a difference between the predictive residual signal and the feedback signal as the quantization input signal. The feedback signal generator is configured by a pole-zero filter that includes a filter coefficient of an all-pole filter which is based on spectral envelope information estimated by the input audio signal, a parameter for adjusting a peak level in the frequency characteristic of the quantization noise caused by the all-pole filter, and the predictive filter coefficient. Due to this configuration, the feedback signal for appropriately modulating the frequency characteristic of the quantization noise after decoding can be generated by the pole-zero filter that includes the filter coefficient of an all-pole filter which is based on spectral envelope information estimated by the input audio signal, the parameter for adjusting a peak level in the frequency characteristic of the quantization noise caused by the all-pole filter, and the predictive filter coefficient.

In the above embodiment of the present invention, the feedback signal generator may be configured by the pole-zero filter that further includes a filter coefficient of a correction filter for decreasing the level of the quantization noise at a predetermined frequency band. Due to this configuration, the level of the quantization noise after decoding at the predetermined frequency band can be decreased. In this case, the information coding apparatus may further include a correction filter controller that performs controls so as to selectively add the correction filter for each frame based on a clipping frequency of the quantizer for each frame. Moreover, the feedback signal generator may further include a changeover switch that selectively adds the correction filter based on the control of the correction filter controller. Due to such a configuration, the correction filter can be selectively added to the feedback signal generator based on the clipping frequency of the quantizer.

When the feedback signal generator is configured by the pole-zero filter that further includes a filter coefficient of a correction filter for decreasing the level of the quantization noise at a predetermined frequency band, the information coding apparatus may further include a correction filter controller that calculates the quantization noise after decoding using the quantization error signal and a transfer function of the feedback signal generator and performs control so as to selectively add the correction filter for each frame based on the ratio of the level of the input audio signal at the predetermined frequency band to the level of the calculated quantization noise for each frame. In this case, the feedback signal generator may further include a changeover switch that selectively adds the correction filter based on the control of the correction filter controller. Due to this configuration, the correction filter can be selectively added to the feedback signal generator based on the ratio of the level of the input audio signal at the predetermined frequency band to the level of the calculated quantization noise.

In the above embodiment of the present invention, the information coding apparatus may further include a parameter setter that sets the value of the parameter into the feedback signal generator for each frame based on a clipping frequency of the quantizer for each frame. Due to this configuration, the value of the parameter for adjusting the peak level in the frequency characteristic of the quantization noise modulated by the all-pole filter can be set based on the clipping frequency of the quantizer.

In the above embodiment of the present invention, the information coding apparatus may further include a parameter setter that detects a spectral peak amplitude of the input audio signal for each frame and sets the value of the parameter into the feedback signal generator for each frame based on the detected peak amplitude. Due to this configuration, the value of the parameter can be set based on the spectral peak amplitude of the input audio signal.

In the above embodiment of the present invention, the information coding apparatus may further include a linear predictive analyzer that supplies a predictive filter coefficient calculated based on spectral envelope information by a linear predictive analysis to the feedback signal generator as the filter coefficient of the all-pole filter. Due to this configuration, the filter coefficient of the all-pole filter can be generated by the linear predictive analysis.

According to the embodiments of the present invention, the frequency characteristic of the quantization noise after decoding can be controlled appropriately.

BRIEF DESCRIPTION OF THE DRAWINGS

FIG. 6 is a diagram showing examples of the frequency characteristic of the quantization noise caused by an audio coding apparatus according to the related art and the frequency characteristic of the quantization noise caused by the configuration of the feedback calculator R(z) shown in FIG. 4;

DESCRIPTION OF THE PREFERRED EMBODIMENTS

Hereinafter, best modes (hereinafter referred to as embodiments) for carrying out the present invention will be described. The description will be given in the following order:

1. First Embodiment (Quantization Noise Control Using Linear Predictive Filter Based On All-Pole Model As Feedback Calculator);

2. Second Embodiment (Quantization Noise Control With Added Correction Filter); And 3. Third Embodiment (Quantization Noise Control With Changeover Switch Added In Feedback Calculator)

1. First Embodiment

Exemplary Configuration of Audio Coding Apparatus

Figure 1:
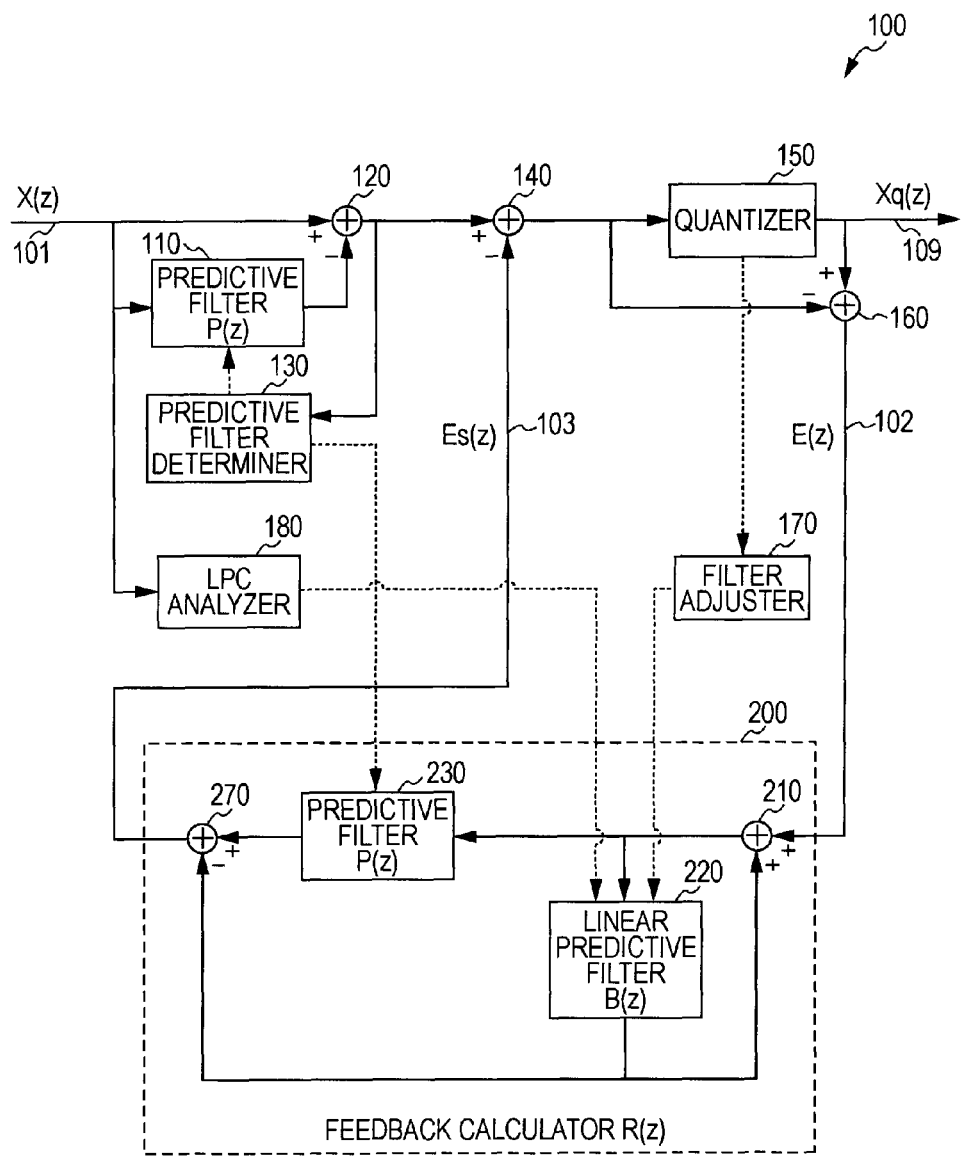
FIG. 1 is a block diagram showing one exemplary configuration of an audio coding apparatus according to a first embodiment of the present invention.

FIG. 1 is a block diagram showing one exemplary configuration of an audio coding apparatus 100 according to a first embodiment of the present invention. The audio coding apparatus 100 is configured to receive an input audio signal X(z) of each frame from a signal line 101 and output a quantized signal Xq(z) from a signal line 109. The frame as used therein refers to a predetermined number of the sample values of sampled discrete time signals. In the drawing, signal lines are depicted by solid lines, and data lines are depicted by dotted lines.

The audio coding apparatus 100 includes a predictive filter P(z) 110, a subtractor 120, a predictive filter determiner 130, subtractors 140 and 160, a quantizer 150, a filter adjuster 170, a LPC analyzer 180, and a feedback calculator R(z) 200. The feedback calculator R(z) 200 includes an adder 210, a linear predictive filter B(z) 220, a predictive filter P(z) 230, and an adder 270.

The predictive filter P(z) 110 is configured to predict the present audio signal based on the past audio signal in the input audio signal X(z) and predictive filter coefficient supplied from the predictive filter determiner 130. The predictive filter P(z) 110 predicts the present sample values by performing a product-sum operation on the past sample values and the predictive filter coefficient. That is to say, the predictive filter P(z) 110 performs arithmetic processing based on Equation 1 to generate the processing results as the predictive signals. The predictive filter P(z) 110 outputs the generated predictive signals to the subtractor 120. The predictive filter P(z) 110 is an example of the predictive signal generator as described in the claims.

The subtractor 120 is configured to calculate a difference between the present audio signal supplied from the signal line 101 and the predictive signal supplied from the predictive filter P(z) 110. The subtractor 120 generates a predictive residual signal by subtracting the predictive signal from the audio signal supplied from the signal line 101. The subtractor 120 outputs the generated predictive residual signal to the subtractor 140. The subtractor 120 is an example of the predictive residual signal generator as described in the claims.

The predictive filter determiner 130 is configured to store therein a plurality of predictive filter coefficients for generating the predictive filter patterns and determine the optimum predictive filter coefficient based on the input audio signal X(z). The predictive filter determiner 130 sequentially sets P (several or several hundred) predictive filter coefficients into the predictive filter P(z) 110. The predictive filter determiner 130 selects a predictive filter coefficient, which makes the maximum value of the predictive residual signal output from the subtractor 120 the lowest, from the P predictive filter coefficients and sets the selected predictive filter coefficient into the predictive filters 110 and 230.

Moreover, the predictive filter determiner 130 may be configured to select a predictive filter coefficient, which is closest to the predictive filter pattern, from the P predictive filter coefficients based on the predictive filter coefficient $p_i$ which is calculated by the LPC analyzer 180, for example. The predictive filter determiner 130 converts LPC coefficients and the P predictive filter coefficients into linear spectral pair (LSP) parameters, for example. Moreover, the predictive filter determiner 130 may be configured to determine the optimum predictive filter coefficient among the P predictive filter coefficients by calculating the distance between the LSP parameters.

The subtractor 140 is configured to calculate a difference between the predictive residual signal output by the subtractor 120 and a feedback signal Es(z) which is the output of the feedback calculator R(z) 200 and supplied from the signal line 103. The subtractor 140 generates a modified predictive residual signal by subtracting the output of the feedback calculator R(z) 200 from the predictive residual signal generated by the subtractor 120. The subtractor 140 outputs the generated modified predictive residual signal to the quantizer 150 and the subtractor 160. The subtractor 140 is an example of the quantization input signal generator as described in the claims.

The quantizer 150 is configured to quantize the modified predictive residual signal generated by the subtractor 140 into a predetermined number of bits. The quantizer 150 quantizes a quantization input signal, which is generated by the subtractor 140 based on the predictive residual signal, thus generating the quantized signal Xq(z) which is a quantization output signal. The quantizer 150 outputs the quantized signal Xq(z) to the signal line 109 and the subtractor 160. The quantizer 150 is an example of the quantizer as described in the claims.

The subtractor 160 is configured to calculate a difference between the modified predictive residual signal generated by the subtractor 140 and the quantized signal Xq(z) quantized by the quantizer 150. The subtractor 160 generates a quantization error signal E(z) by subtracting the modified predictive residual signal from the quantized signal Xq(z) quantized by the quantizer 150. That is to say, the subtractor 160 generates the difference between the quantization input signal and the quantization output signal as the quantization error signal E(z). The subtractor 160 outputs the generated quantization error signal E(z) to the feedback calculator R(z) 200 via the signal line 102. The subtractor 160 is an example of the quantization error signal generator as described in the claims.

The LPC analyzer 180 is configured to perform an LPC analysis on the input audio signal X(z). The LPC analyzer 180 generates the predictive filter coefficients based on spectral envelope information which is calculated by the LPC analysis. The LPC analyzer 180 supplies the generated predictive filter coefficients to the linear predictive filter B(z) 220 of the feedback calculator R(z) 200. Although the filter coefficients $b_k$ of the linear predictive filter B(z) 220 are described as being generated by the LPC analysis, the filter coefficient $b_k$ may be generated by the Cepstrum method. The LPC analyzer 180 is an example of the linear predictive analyzer as described in the claims.

The feedback calculator R(z) 200 is a noise shaping filter that generates a feedback signal Es(z) for controlling the frequency characteristic of the quantization noise after decoding based on the quantization error signal E(z) from the subtractor 160. The feedback calculator R(z) 200 is configured by a pole-zero filter. The feedback calculator R(z) 200 includes the filter coefficients of the all-pole filter, which are based on the spectral envelope information estimated from the input audio signal, and parameters for adjusting the peak level in the frequency characteristic of the quantization noise caused by the all-pole filter. The feedback calculator R(z) 200 also includes the predictive filter coefficients. That is to say, the feedback calculator R(z) 200 is expressed by a transfer function given in Equation 4. The pole-zero filter as used herein refers to a filter obtained by combining an all-pole filter and an all-zero filter.

$$R(z) = 1 - \frac{1 - P(z)}{1 - B(z)} = \frac{P(z) - B(z)}{1 - B(z)} \qquad \text{Equation 4}$$

In this equation, P(z) is configured based on Equation 1. B(z) is configured based on Equation 5.

$$B(z) = \sum_{k=1}^{Nb} \lambda^k b_k z^{-k} \qquad \text{Equation 5}$$

Figure 15:
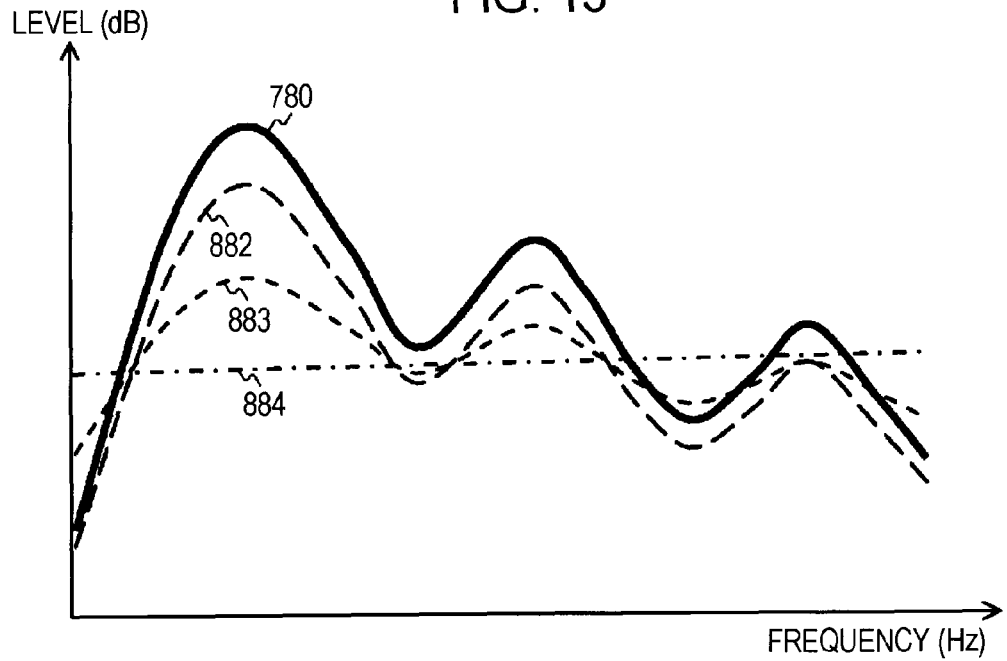
FIG. 15 is a diagram showing an example of the frequency characteristic of the quantization noise modulated by a feedback calculator R(z) of an audio coding apparatus.

In this equation, B(z) is a linear predictive filter based on an all-pole model of the input audio signal X(z). $\lambda$ is an adjustment parameter for adjusting the peak level in the frequency characteristic of the quantization noise after decoding. The adjustment parameter $\lambda$ is set to values equal to or greater than "0" and equal to or smaller than "1." In the embodiment of the present invention, the adjustment parameter $\lambda$ is included in the denominator polynomial of the transfer function of the feedback calculator R(z) 200. Therefore, the change in the frequency characteristic of the quantization noise after decoding depending on the magnitude of the adjustment parameter $\lambda$ is opposite to that shown in FIG. 15. For example, in the embodiment of the present invention, the frequency characteristic of the quantization noise approaches the waveform of the input audio signal X(z) as the adjustment parameter $\lambda$ increases (close to "1"), whereas the frequency characteristic shows a flat characteristic as the adjustment parameter $\lambda$ decreases (close to "0"). Moreover, if the frequency characteristic of the quantization noise is too flat, noise is likely to be heard. On the contrary, if the peak level is too high, the feedback signal Es(z) increases too much, and thus the clipping frequency of the quantizer 150 increases. For this reason, the adjustment parameter $\lambda$ is typically set to a range of "0.4" to "0.8."

In Equation 5, $b_k$ is the predictive filter coefficient which is generated by the LPC analyzer 180 in the embodiment of the present invention. The predictive filter coefficient $b_k$ represents the spectral envelope information of the input audio signal X(z). Nb is the order of the linear predictive filter B(z) and is typically set to a range of "16" to "32."

As described above, the feedback calculator R(z) 200 performs arithmetic processing based on Equation 4. The feedback calculator R(z) 200 supplies the generated feedback signal Es(z) to the subtractor 140 via the signal line 103. The feedback calculator R(z) 200 is an example of the feedback signal generator as described in the claims. Moreover, the feedback calculator R(z) 200 shown in FIG. 1 is a non-limiting example of the configuration that is implemented by Equation 4.

The adder 210 is configured to feed back the output of the linear predictive filter B(z) 220 to the quantization error signal E(z) generated by the subtractor 160. Therefore, the transfer function of the feedback calculator R(z) 200 includes the transfer function of the linear predictive filter B(z) 220 in its denominator term. That is to say, an all-pole filter of 1/(1−B(z)) is configured by the adder 210 and the linear predictive filter B(z) 220. The adder 210 adds the output of the linear predictive filter B(z) 220 to the quantization error signal E(z) and output the results to the linear predictive filter B(z) 220 and the predictive filter P(z) 230.

The linear predictive filter B(z) 220 is a linear predictive filter based all-pole model of the input audio signal X(z). The linear predictive filter B(z) 220 performs a product-sum operation based on the predictive filter coefficient $b_k$ generated by the LPC analyzer 180, the adjustment parameter λ generated by the filter adjuster 170, and the output from the adder 210. That is to say, the linear predictive filter B(z) 220 performs arithmetic processing based on Equation 5. The linear predictive filter B(z) 220 supplies the results calculated based on Equation 5 to the adder 210 and the subtractor 270. The predictive filter coefficient $b_k$ and the adjustment parameter λ used by the linear predictive filter B(z) 220 are respectively examples of the filter coefficient of the all-pole filter and the parameter for adjusting the peak level in the frequency characteristic of the quantization noise, as described in the claims.

The predictive filter P(z) 230 is configured to planarize the frequency characteristic of the quantization noise modulated by the predictive filter P(z) 110. The predictive filter P(z) 230 performs a product-sum operation on the predictive filter coefficient $p_i$ supplied from the predictive filter determiner 130 and the output from the adder 210. That is, the predictive filter P(z) 230 has the same configuration as the predictive filter P(z) 110 and performs arithmetic processing based on Equation 1. The predictive filter P(z) 230 supplies the results calculated based on Equation 1 to the subtractor 270. The predictive filter coefficient $p_i$ used by the predictive filter P(z) 230 is an example of the predictive filter coefficient as described in the claims.

The subtractor 270 is configured to calculate the difference between the output of the linear predictive filter B(z) 220 and the output of the predictive filter P(z) 230. The subtractor 270 subtracts the output of the linear predictive filter B(z) 220 from the output of the predictive filter P(z) 230 and outputs the subtraction results to the subtractor 140 via the signal line 103 as the feedback signal Es(z).

The filter adjuster 170 is configured to set the adjustment parameter λ of the linear predictive filter B(z) 220 based on the clipping frequency of the quantizer 150. The filter adjuster 170 counts the clipping frequency of the quantizer 150 for the past frames and sets the value of the adjustment parameter λ for the present frame based on the clip count. In this example, the filter adjuster 170 sets the initial value of the adjustment parameter λ to "0.8." When the clip count in the quantizer 150 in the immediately previous frame is smaller than a predetermined lower-limit threshold Ta, the filter adjuster 170 increases the adjustment parameter λ by "0.001." On the other hand, when the clip count is equal to or greater than a predetermined upper-limit threshold Tb, the filter adjuster 170 decreases the adjustment parameter λ by "0.001."

Moreover, the filter adjuster 170 counts the clipping frequency of the quantizer 150 in the present frame and sets the value of the adjustment parameter λ of the present frame based on the clip count. In this example, the filter adjuster 170 sets the initial value of the adjustment parameter λ to "1.0." The filter adjuster 170 counts the clip count in the quantizer 150 when the entire sample values (frame data) in the input frame are quantized. When the clip count is equal to or greater than a predetermined threshold Tc, the filter adjuster 170 sets the lower limit of the adjustment parameter λ to "0.3" and multiplies the adjustment parameter λ by "0.9" and the frame data of the present frame are requantized. The filter adjuster 170 repeats the requantization until the adjustment parameter λ becomes smaller than "0.3" or the clip count becomes smaller than the threshold Tc. The filter adjuster 170 is an example of the parameter setter as described in the claims.

As described above, the feedback calculator R(z) 200 is configured by a linear predictive filter (1/(1−B(z))) based on all-pole model, which is formed by the adder 210 and the linear predictive filter B(z) 220. For this reason, differently from the transfer function R(z) given in Equation 2, it is possible to increase the order Nb of the linear predictive filter B(z) 220 independently without being limited by the order Np of the predictive filter P(z) 110. Therefore, even when the order Np of the predictive filter P(z) 110 is low or the predictive signal is generated with limited predictive filter patterns, it is possible to match the waveform of the frequency characteristic of the quantization noise after decoding to the waveform of the input audio signal X(z).

Figure 16:
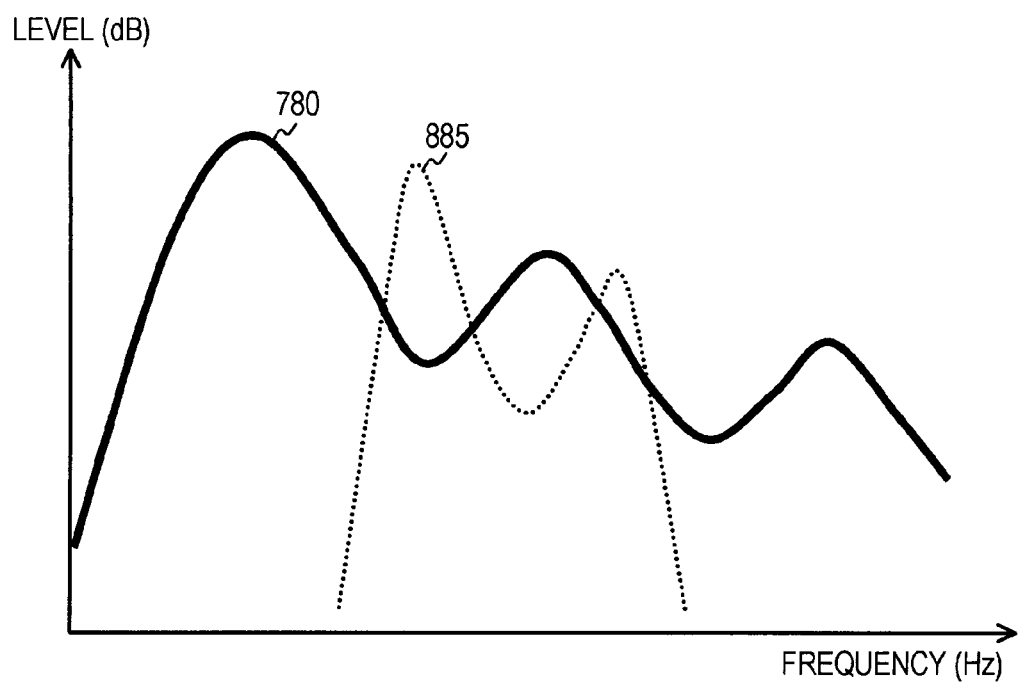
FIG. 16 is a diagram showing an example of the frequency characteristic of the quantization noise output from the audio decoding apparatus when the order of a predictive filter is low and the number of patterns of the predictive filter is small.

Moreover, the predictive filter P(z) 230 enables the obtaining of a flat frequency characteristic of the quantization noise resulting from the predictive filter P(z) 110. Therefore, even when the frequency characteristic of the quantization noise is inappropriate due to the predictive filter P(z) 110 with the low order Np as in the case of FIG. 16, the frequency characteristic of the quantization noise can be appropriately modulated without being affected by the predictive filter P(z) 110. That is to say, the frequency characteristic of the quantization noise can be controlled with the characteristic of only the linear predictive filter (1/(1−B(z))) based on an all-pole model.

Furthermore, by adjusting the adjustment parameter λ of the linear predictive filter B(z) 220 based on the clipping frequency of the quantizer 150, the clipping frequency of the quantizer 150 can be decreased. In this way, deterioration in the audio quality due to coding can be reduced.

Next, the operation of the filter adjuster 170 of the audio coding apparatus 100 according to the first embodiment of the present invention will be described with reference to the drawings.

Example of Adjustment Parameter Setting Method

Figure 2:
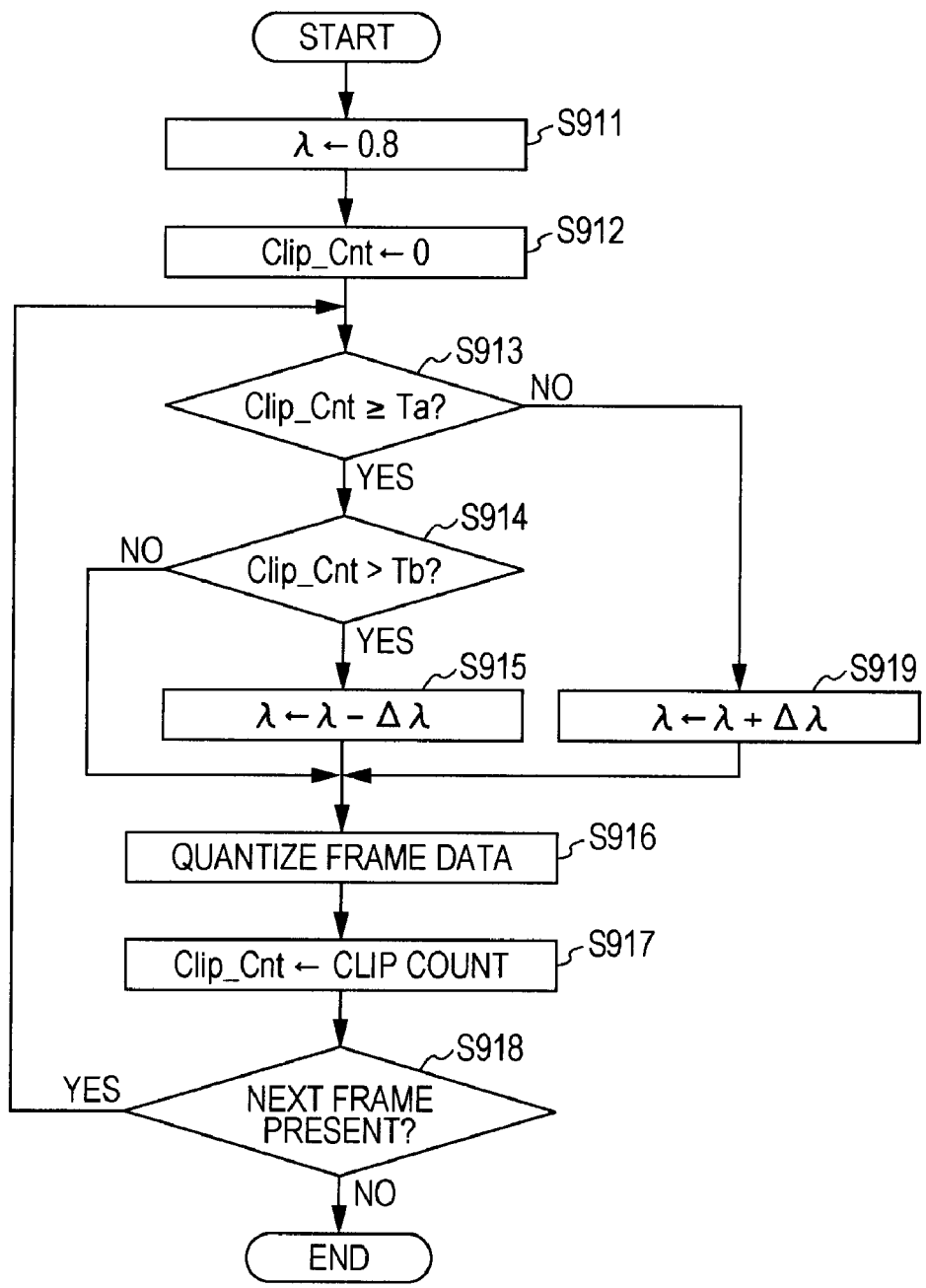
FIG. 2 is a flowchart showing an example of the processing procedures of the method for setting adjustment parameters by a filter adjuster according to the first embodiment of the present invention.

FIG. 2 is a flowchart showing an example of the processing procedures of the method for setting adjustment parameters by the filter adjuster 170 according to the first embodiment of the present invention.

First, the filter adjuster 170 sets the value of the adjustment parameter λ of the linear predictive filter B(z) 220 to the initial value "0.8" (step S911). Next, the filter adjuster 170 sets a clip count Clip_Cnt to the initial value "0" (step S912). The clip count Clip_Cnt is later changed automatically such that the value of the clip count in the quantizer 150 for the previous frame is set to the clip count Clip_Cnt.

Next, the filter adjuster 170 makes a determination as to whether or not the value of the clip count Clip_Cnt is equal to or greater than a predetermined threshold Ta (step S913). When the value of the clip count Clip_Cnt is smaller than the threshold Ta, a predetermined value Δλ, for example, "0.001" is added to the value of the adjustment parameter λ, and the added value is set into the linear predictive filter B(z) 220 (step S919).

On the other hand, when the value of the clip count Clip_Cnt is equal to or greater than the threshold Ta, a determination is made as to whether or not the value of the clip count Clip_Cnt is greater than a predetermined threshold Tb (step S914). When the value of the clip count Clip_Cnt is equal to or smaller than the threshold Tb, the flow proceeds to step S916. On the other hand, when the value of the clip count Clip_Cnt is greater than the threshold Tb, a predetermined value Δλ, for example, "0.001" is subtracted from the value of the adjustment parameter λ, and the subtracted value is set into the linear predictive filter B(z) 220 (step S915).

Next, the quantizer 150 quantizes the sample values (frame data) of a frame which is to be quantized (step S916). At that time, the filter adjuster 170 counts the number of clippings in the quantizer 150 for that frame, and the counted number is set to the clip count Clip_Cnt (step S917).

Thereafter, a determination is made as to whether or not there is a next frame to be quantized (step S918). When there is the next frame, the flow returns to S912, and the value of the adjustment parameter λ is set based on the clip count Clip_Cnt in the previous frame. On the other hand, when there is no next frame, the operation of setting the adjustment parameter λ by the filter adjuster 170 ends.

Modification of Adjustment Parameter Setting Method

Figure 3:
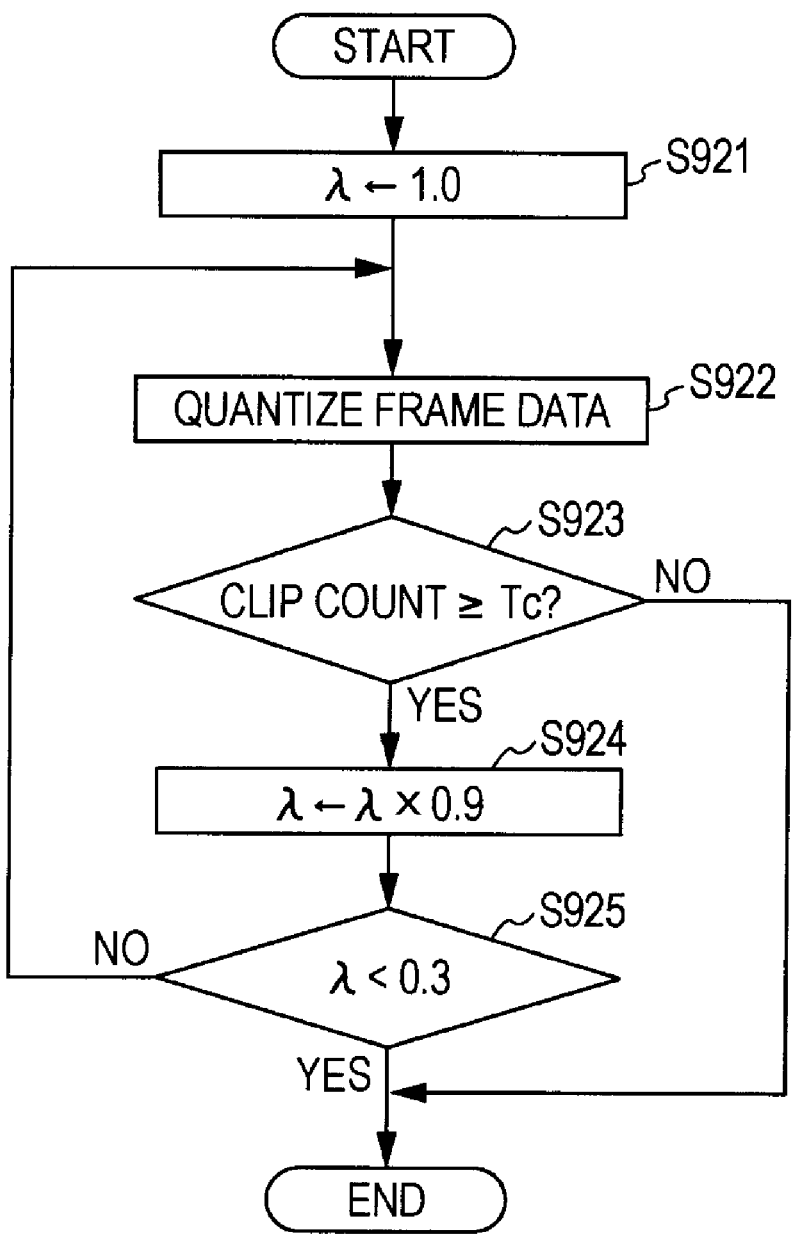
FIG. 3 is a flowchart showing a modification of the processing procedures of the method for setting adjustment parameters by the filter adjuster according to the first embodiment of the present invention.

FIG. 3 is a flowchart showing a modification of the processing procedures of the method for setting adjustment parameters by the filter adjuster 170 according to the first embodiment of the present invention.

First, the filter adjuster 170 sets the value of the adjustment parameter λ of the linear predictive filter B(z) 220 to the initial value "1.0" (step S921). Next, the quantizer 150 quantizes the sample values of the present frame which is to be quantized (step S922). Then, the filter adjuster 170 counts the clipping frequency of the quantizer 150 and makes a determination as to whether or not the clip count is smaller than a predetermined threshold Tc (step S923). When the clip count is smaller than the threshold Tc, the operation of quantizing the present frame ends.

On the other hand, when the clip count is equal to or greater than the threshold Tc, a value obtained by multiplying the value of the adjustment parameter λ by "0.9" is set into the linear predictive filter B(z) 220 (step S924). Next, the filter adjuster 170 makes a determination as to whether or not the calculated value of the adjustment parameter λ is equal to or greater than "0.3" (step S925). When the value of the adjustment parameter λ is equal to or greater than "0.3," the flow proceeds to step S912, and the quantizer 150 requantizes the present frame: this loop repeats until the clip count becomes smaller than the threshold Tc. On the other hand, when the value of the adjustment parameter λ is smaller than "0.3," the operation of quantizing the present frame ends, and an operation of quantizing the next frame is performed.

As described above, according to the first embodiment of the present invention, since the feedback calculator R(z) 200 is configured by the linear predictive filter (1/(1−B(z)) based on an all-pole model, it is possible to match the waveform of the frequency characteristic of the quantization noise after decoding to the waveform of the input audio signal. Therefore, it is possible to obtain the auditory masking effects and suppress the generation of annoying noise. In the case of the linear predictive filter (1/(1−B(z)) based on an all-pole model, it is difficult to control the valley portions of the frequency characteristic of the quantization noise. In some cases, the level of the quantization noise in the valley portions of the input audio signal is higher than that of the input audio signal. Therefore, according to a second embodiment of the present invention, which will be described below, the present embodiment is further improved so that the quantization noise in the valley portions of the input audio signal waveform can be suppressed to be low.

2. Second Embodiment

Exemplary Configuration of Audio Coding Apparatus

Figure 4:
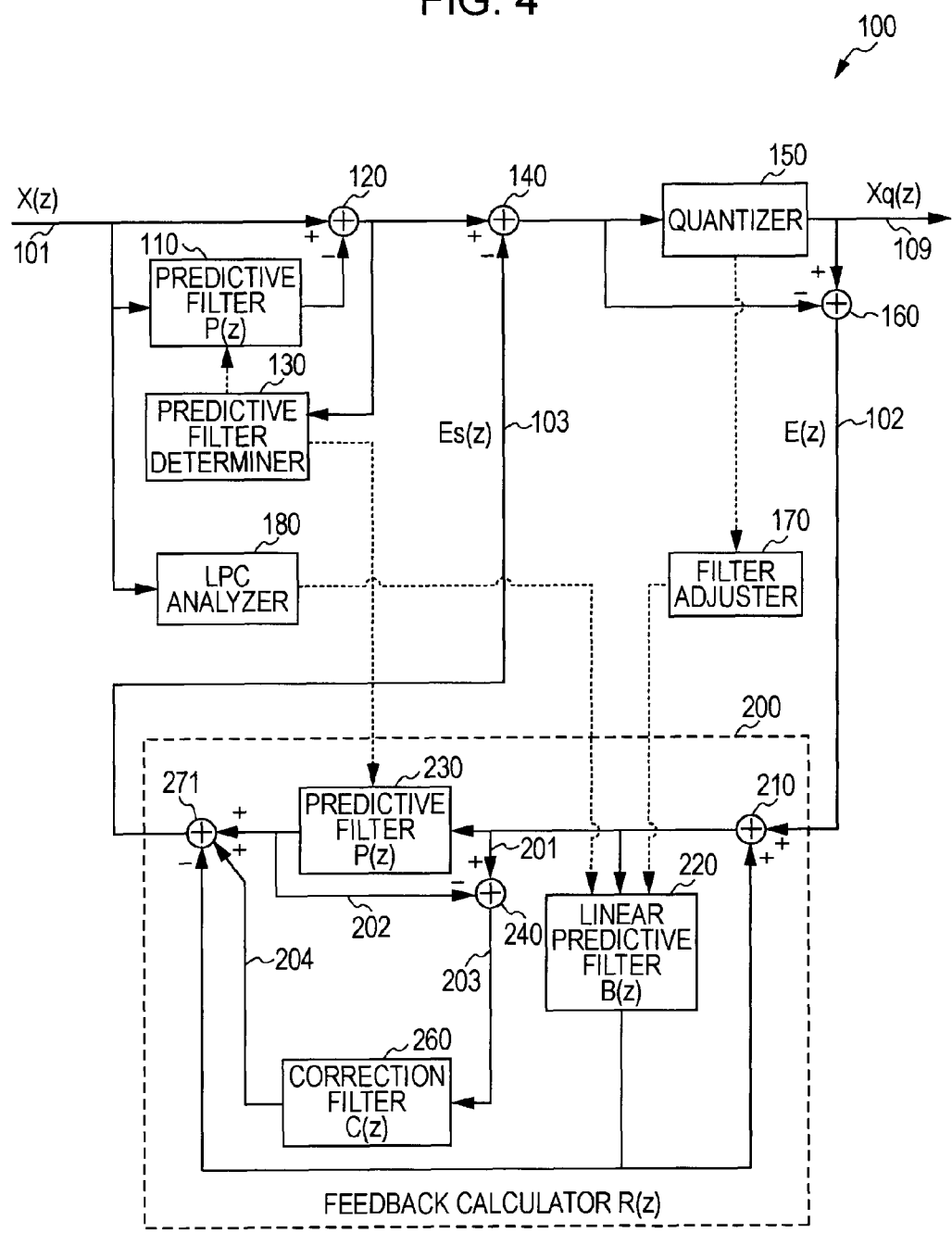
FIG. 4 is a block diagram showing one exemplary configuration of an audio coding apparatus according to a second embodiment of the present invention.

FIG. 4 is a block diagram showing one exemplary configuration of an audio coding apparatus 100 according to the second embodiment of the present invention. In this example, the audio coding apparatus 100 shown in FIG. 4 includes signal lines 201 to 204, a subtractor 240, a correction filter C(z) 260, and an adder 271, in lieu of the subtractor 270 of the audio coding apparatus 100 shown in FIG. 1. Since other components other than these components are the same as those shown in FIG. 1, they will be denoted by the same reference numerals and will not be described herein. In the drawing, signal lines are depicted by solid lines, and data lines are depicted by dotted lines.

In this example, the feedback calculator R(z) 200 further includes a filter coefficient of a correction filter for decreasing the level of the quantization noise at the low-frequency band, in addition to the filter coefficient included in the feedback calculator R(z) 200 shown in FIG. 1. That is to say, the feedback calculator R(z) 200 is expressed by a transfer function given in Equation 6.

$$R(z) = 1 - \frac{(1-P(z))(1-C(z))}{1-B(z)} \qquad \text{Equation 6}$$
$$= \frac{P(z) + C(z) - P(z)C(z) - B(z)}{1-B(z)}$$

In this equation, P(z) and B(z) are configured based on Equation 1 and Equation 5, respectively. C(z) is configured based on Equation 7.

$$C(z) = \sum_{c=1}^{Nc} c_k z^{-k} \qquad \text{Equation 7}$$

In this equation, C(z) is a correction filter for decreasing the level of the low-frequency component of the quantization noise caused by the all-pole filter. $c_k$ is a predetermined correction filter coefficient. Nc is the order of the correction filter C(z). The feedback calculator R(z) 200 is an example of the feedback signal generator as described in the claims. The feedback calculator R(z) 200 shown in FIG. 4 is a non-limiting example of the configuration that is implemented by Equation 6.

The subtractor 240 is configured to calculate the difference between the output of the adder 210 supplied from the signal line 201 and the output of the predictive filter P(z) 230 supplied from the signal line 202. The subtractor 240 subtracts the output of the predictive filter P(z) 230 from the output of the adder 201 and outputs the subtraction results to the correction filter C(z) 260 via the signal line 203.

The correction filter C(z) 260 is configured to decrease the level of the low-frequency component of the quantization noise after decoding which is modulated by the all-pole filter. The correction filter C(z) 260 is configured based on Equation 7. For example, the correction filter C(z) 260 is configured by a second-order high-pass filter (HPF) given by the following equation in order to correct the low-frequency component of the quantization noise.

$$1-C(z)=1-0.6z^{-1}+0.09z^{-2}$$

The correction filter C(z) 260 performs arithmetic processing based on the above equation and supplies the processing results to the adder 271 via the signal line 204. Therefore, the transfer function of the feedback calculator R(z) 200 includes the transfer function of the correction filter C(z) 260 in its nominator term, and thus the level of the low-frequency component of the quantization noise can be suppressed. The correction filter coefficient $c_k$ of the correction filter C(z) 260 is an example of the filter coefficient of the correction filter as described in the claims.

The adder 271 is configured to add the inverted output of the linear predictive filter B(z) 220, the output of the predictive filter P(z) 230, and the output of the correction filter C(z) 260. The adder 271 outputs the added signal to the subtractor 140 as a feedback signal Es(z).

An example of the frequency characteristic of the quantization noise when the correction filter C(z) 260 is provided to the feedback calculator R(z) 200 will be described below.

Figure 5A:
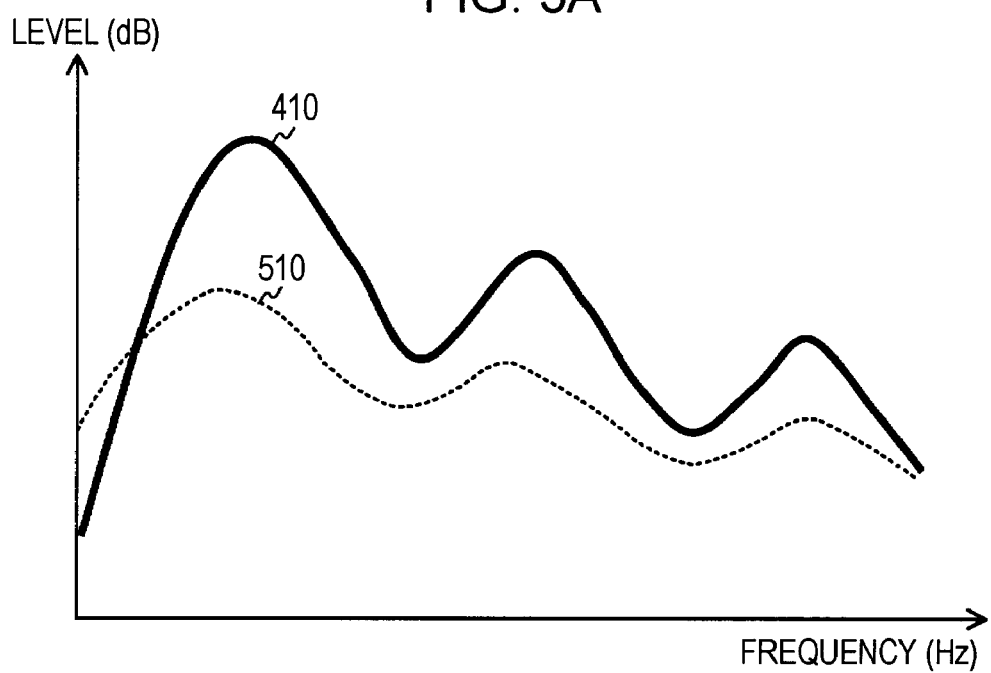
FIGS. 5A and 5B are diagrams showing examples of the frequency characteristic of the quantization noise after decoding when a correction filter C(z) is provided to a feedback calculator R(z)
Figure 5B:
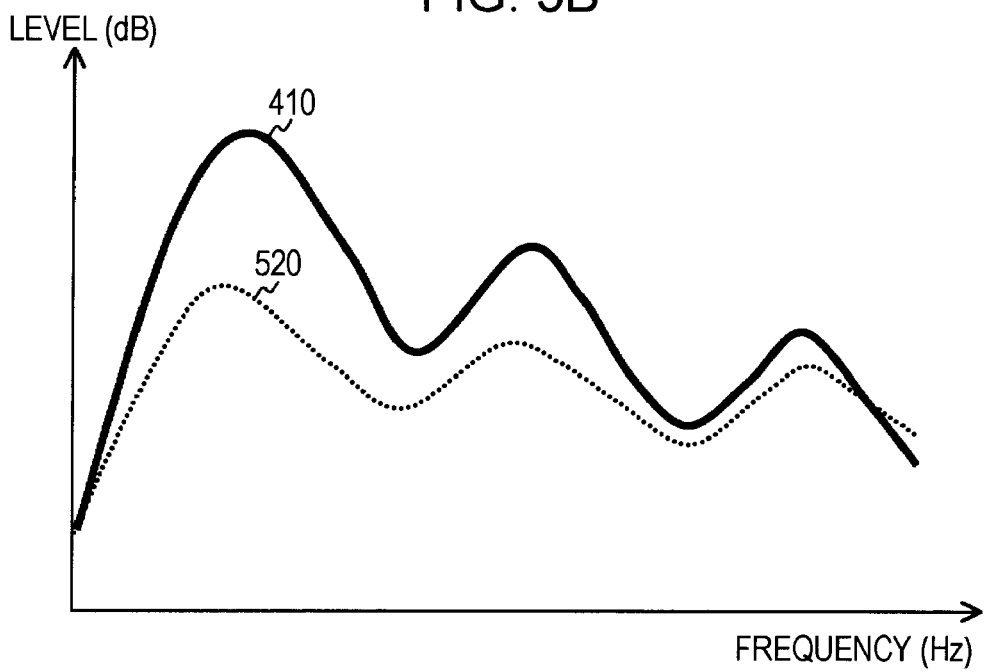

Example of Frequency Characteristic of Quantization Noise with Added Correction Filter FIGS. 5A and 5B are diagrams showing examples of the frequency characteristic of the quantization noise after decoding when the correction filter C(z) 260 is provided to the feedback calculator R(z) 200. Specifically, FIG. 5A is a diagram showing the frequency characteristic of the quantization noise when the correction filter C(z) 260 is not provided. FIG. 5B is a diagram showing the frequency characteristic of the quantization noise when the correction filter C(z) 260 is provided. In the drawings, the vertical axis represents level and the horizontal axis represents frequency.

In FIG. 5A, the frequency characteristic of the input audio signal is represented by the solid line 410, and the frequency characteristic of the quantization noise is represented by the broken line 510. The frequency characteristic 410 of the input audio signal is the frequency characteristic of the input audio signal X(z) input to the audio coding apparatus 100. The waveform of the frequency characteristic 410 of the input audio signal has three peaks (poles), and the peak level decreases as the frequency decreases.

The frequency characteristic 510 of the quantization noise is the frequency characteristic of the quantization noise after decoding when the correction filter C(z) 260 is not provided. The frequency characteristic 510 of the quantization noise has peaks (poles) at the same frequencies as those in the frequency characteristic 410 of the input audio signal.

As described above, when the quantization noise is modulated by the all-pole filter, the level in the frequency characteristic 510 of the quantization noise at a frequency band near 0 Hz is often higher than the level in the frequency characteristic 410 of the input audio signal at that frequency band. In this case, annoying noise is likely to be heard due to the effect of the quantization noise at the low-frequency band.

In FIG. 5B, the frequency characteristic of the input audio signal is represented by the solid line 410, and the frequency characteristic of the quantization noise is represented by the broken line 520. The frequency characteristic 410 of the input audio signal has the same characteristic as that in FIG. 5A and will be denoted by the same reference numeral and thus will not be described herein. The frequency characteristic 420 of the quantization noise is the frequency characteristic of the quantization noise after decoding when the feedback calculator R(z) 200 is provided to the correction filter C(z) 260.

The correction filter C(z) 260 provided to the feedback calculator R(z) 200 enables the suppression of the level of the quantization noise at the low-frequency band so as to be lower than that of the input audio signal, thus suppressing the generation of annoying noise. In this case, although the level of the high-frequency component of the quantization noise may increase slightly, since high-frequency noise is not likely to be heard by the human ears, the effects thereof are negligible.

FIG. 6 is a diagram showing examples of the frequency characteristic of the quantization noise caused by an audio coding apparatus 700 according to the related art and the frequency characteristic of the quantization noise caused by the configuration of the feedback calculator R(z) 200 shown in FIG. 4. In the drawing, the frequency characteristic of the input audio signal is represented by the solid line 410; the frequency characteristic of the quantization noise is represented by the dotted line 520; and the frequency characteristic of the quantization noise caused by the audio coding apparatus 700 according to the related art is represented by the broken line 840. In this example, the frequency characteristic 410 of the input audio signal and the frequency characteristic 520 of the quantization noise have the same characteristics as that in FIG. 5B and will be denoted by the same reference numeral and thus will not be described herein.

The frequency characteristic 840 of the quantization noise caused by the audio coding apparatus 700 according to the related art is the frequency characteristic of the quantization noise modulated by the feedback calculator R(z) 760 which is configured based on Equation 2. The frequency characteristic 840 of the quantization noise has two peaks (poles) smaller than that in the frequency characteristic 410 of the input audio signal. Moreover, the frequency characteristic 840 of the quantization noise shows a higher level in the low-frequency band than that in the frequency characteristic 410 of the input audio signal.

As described above, the feedback calculator R(z) 200 enables the matching of the frequency characteristic of the quantization noise to the waveform of the input audio signal even when the order Np of the predictive filter P(z) 110 is low or the limited predictive filter patterns are used. Moreover, the feedback calculator R(z) 200 provided with the correction filter C(z) 260 enables the sufficient suppression of the level of the low-frequency component of the quantization noise after decoding.

According to the second embodiment of the present invention, due to the correction filter C(z) 260 provided to the feedback calculator R(z) 200, it is possible to decrease the level of the quantization noise after decoding at the low-frequency band compared to the first embodiment of the present invention. Therefore, it is possible to suppress the generation of annoying noise caused by the low-frequency component of the quantization noise. In some cases, the level of the feedback signal Es(z) generated by the feedback calculator R(z) 200 becomes too high due to the action of the correction filter C(z) 260. In such cases, the clipping frequency of the quantizer 150 increases too much, and thus the decoded signals will produce unnatural sound. Therefore, according to a third embodiment of the present invention, which will be described below, the present embodiment is further improved so that the clipping frequency of the quantizer 150 can be suppressed to be low.

3. Third Embodiment

Exemplary Configuration of Audio Coding Apparatus

Figure 7:
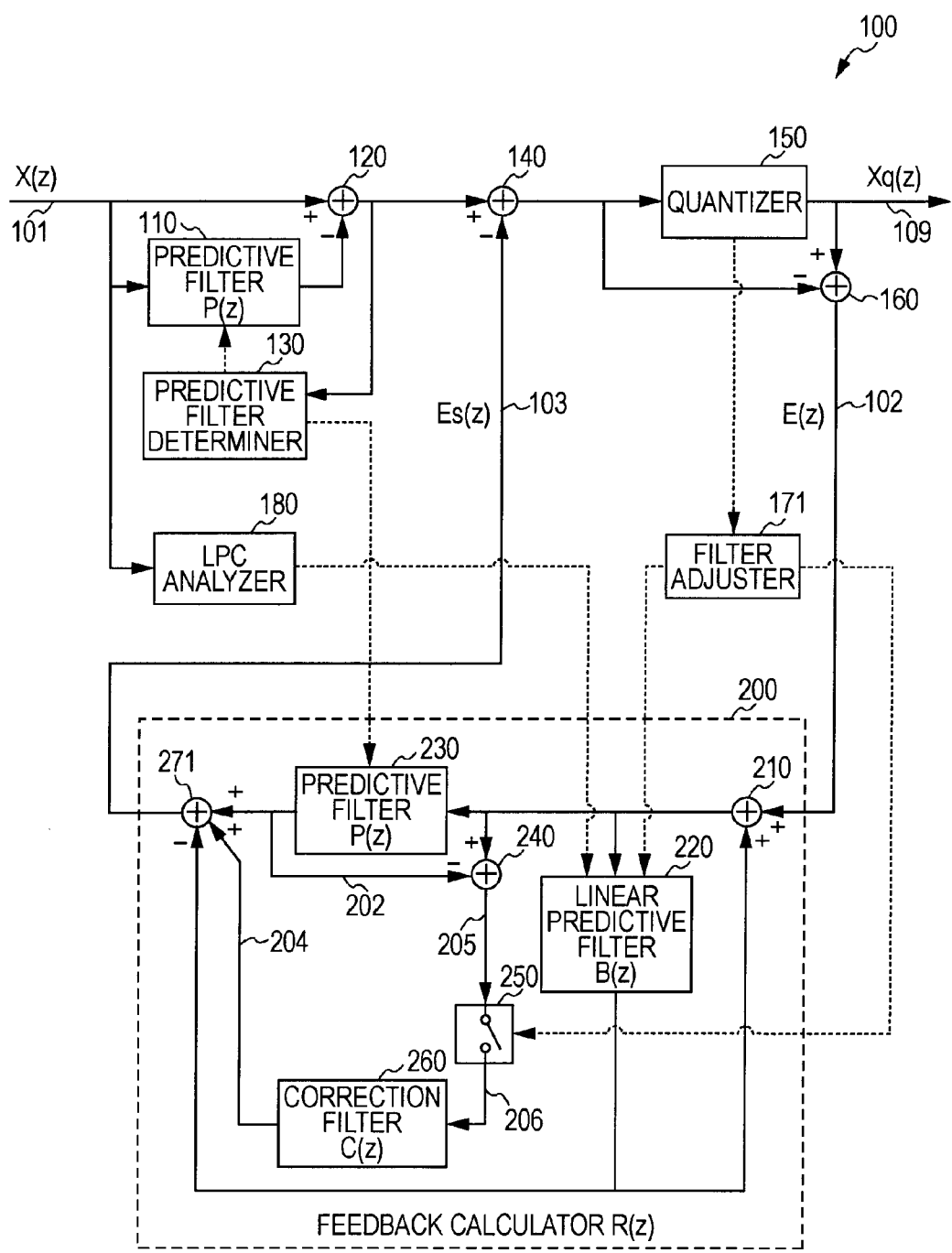
FIG. 7 is a block diagram showing an exemplary configuration of an audio coding apparatus according to a third embodiment of the present invention.

FIG. 7 is a block diagram showing an exemplary configuration of an audio coding apparatus 100 according to the third embodiment of the present invention. In this example, the audio coding apparatus 100 shown in FIG. 7 includes a filter adjuster 171, signal lines 205 and 206, and a changeover switch 250, in lieu of the filter adjuster 170 shown in FIG. 4.

The filter adjuster 171 is configured to determine whether or not the correction filter C(z) 260 of the feedback calculator R(z) 200 will be enabled based on the clipping frequency of the quantizer 150. That is to say, the filter adjuster 171 controls the changeover switch 250 so as to selectively add the correction filter C(z) 260 to the feedback calculator R(z) 200 for each frame based on the clipping frequency of the quantizer 150 for each frame.

For example, the filter adjuster 171 determines whether or not the correction filter C(z) 260 of the feedback calculator R(z) 200 will be disabled based on the clip count in the quantizer 150 for the present frame. In this example, the filter adjuster 171 switches on the changeover switch 250 before the present frame data are input. When the present frame data are quantized by the quantizer 150, the filter adjuster 171 counts the clip count in the quantizer 150 for the present frame. When the counted clip count is equal to or greater than a predetermined threshold Td, the filter adjuster 171 switches off the changeover switch 250 so that the frame data of the present frame are requantized. On the other hand, when the clip count in the quantizer 150 for the present frame is smaller than the threshold Td, the frame data of the next frame are quantized.

Moreover, the filter adjuster 171 enables or disables the correction filter C(z) 260 of the feedback calculator R(z) 200 based on the clip count in the quantizer 150 for the past frame, for example. In this example, when the clip count in the quantizer 150 for the past frame is smaller than a predetermined threshold Te, the filter adjuster 171 switches on the changeover switch 250 to enable the correction filter C(z) 260. On the other hand, when the clip count in the quantizer 150 is equal to or greater than the threshold Te, the filter adjuster 171 switches off the changeover switch 250 to disable the correction filter C(z) 260. Except for the above-described operations, the filter adjuster 171 performs the same operations as those of the filter adjuster 170. The filter adjuster 171 is an example of the correction filter controller as described in the claims.

The changeover switch 250 is configured to selectively add the correction filter C(z) 260 in accordance with the control of the filter adjuster 171. The changeover switch 250 outputs the output of the subtractor 240 supplied from the signal line 205 to the correction filter C(z) 260 via the signal line 206 in accordance with the control of the filter adjuster 171. For example, in the ON state, the changeover switch 250 outputs the output of the subtractor 240 to the correction filter C(z) 260. The changeover switch 250 is an example of the changeover switch as described in the claims.

As described above, according to the third embodiment of the present invention, the filter adjuster 171 and the changeover switch 250 enable selective use of the correction filter C(z) 260 based on the clipping frequency of the quantizer 150. Due to this configuration, when the clipping frequency of the quantizer 150 is high, the clipping frequency is suppressed, and thus the generation of unnatural sound is prevented. When the clipping frequency is low, the level of the low-frequency component of the quantization noise is decreased, and thus the generation of annoying noise can be suppressed.

Next, the operation of the filter adjuster 171 of the audio coding apparatus 100 according to the third embodiment of the present invention will be described with reference to the drawings.

Exemplary Method for Selectively Adding Correction Filter by Filter Adjuster

Figure 8:
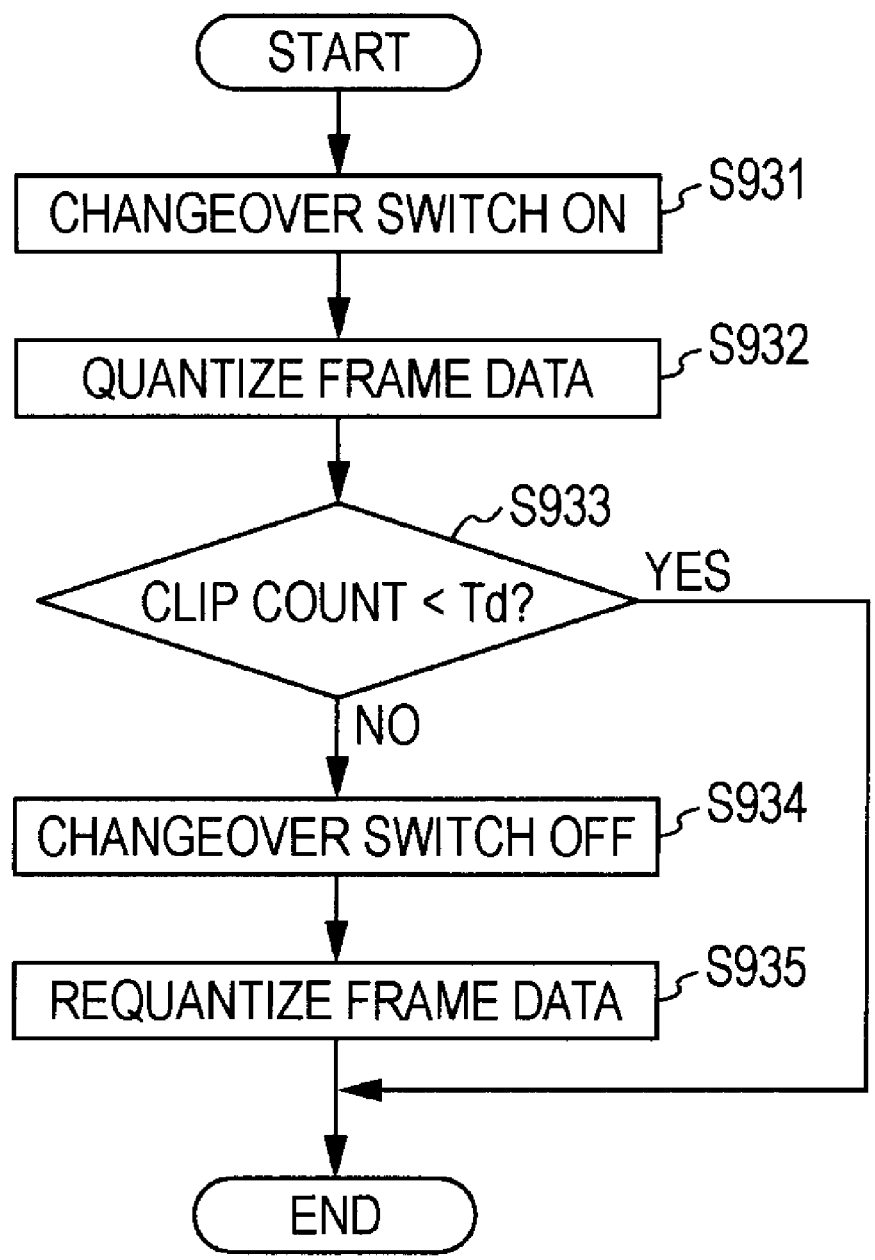
FIG. 8 is a flowchart showing an example of the processing procedures of the method for selectively adding a correction filter C(z) to a feedback calculator R(z) by a filter adjuster according to the third embodiment of the present invention.

FIG. 8 is a flowchart showing an example of the processing procedures of the method for selectively adding the correction filter C(z) 260 to the feedback calculator R(z) 200 by the filter adjuster 171 according to the third embodiment of the present invention.

First, when a frame to be quantized is input, the changeover switch 250 is switched on (step S931). Next, the quantizer 150 quantizes the sample values of the input frame (step s932). At this time, the filter adjuster 171 counts the clip count in the quantizer 150 for the input frame and makes a determination as to whether or not the clip count is smaller than a predetermined threshold Td (step S933). When the clip count is smaller than the threshold Td, the quantization operation ends and the next frame is processed.

On the other hand, when the clip count is equal to or greater than the threshold Td, the filter adjuster 171 switches off the changeover switch 250 (step S934). Then, the frame data of the input frame are requantized (step S935), and the next frame is processed.

Modified Method for Selectively Adding Correction Filter by Filter Adjuster

Figure 9:
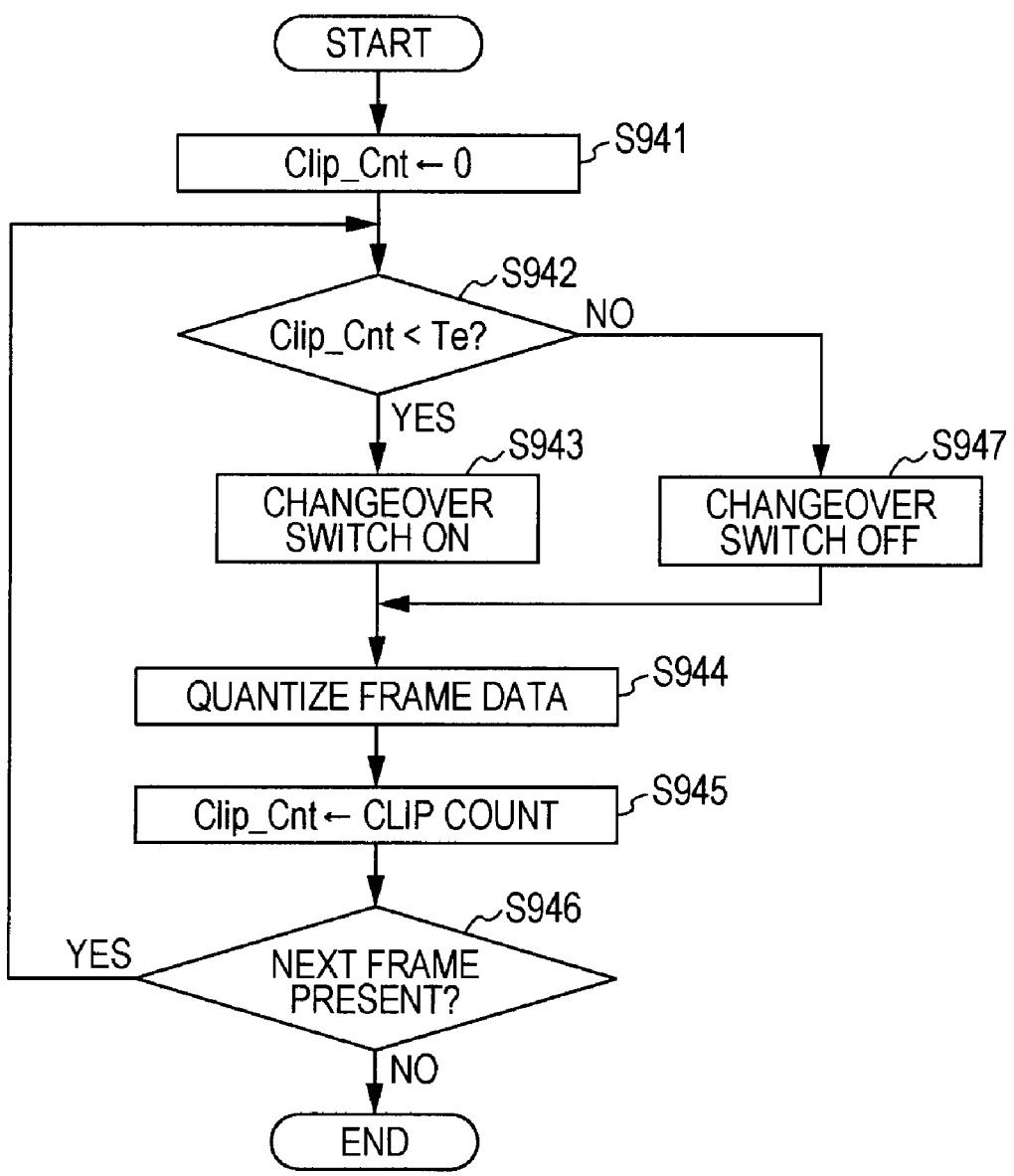
FIG. 9 is a flowchart showing a modification of the processing procedures of the method for selectively adding the correction filter C(z) by the filter adjuster according to the third embodiment of the present invention.

FIG. 9 is a flowchart showing a modification of the processing procedures of the method for selectively adding the correction filter 260 by the filter adjuster 171 according to the third embodiment of the present invention.

First, the filter adjuster 171 sets the clip count Clip_Cnt to the initial value, for example, "0" (step S941). The clip count Clip_Cnt is later changed automatically such that the value of the clip count in the quantizer 150 for the previous frame is set to the clip count Clip_Cnt.

Next, the filter adjuster 171 makes a determination as to whether or not the value of the clip count Clip_Cnt is equal to or greater than a predetermined threshold Te (step S942). When the value of the clip count Clip_Cnt is smaller than the threshold Te, the filter adjuster 171 switches on the changeover switch 250 (step S943). On the other hand, when the value of the clip count Clip_Cnt is equal to or greater than the threshold Te, the filter adjuster 171 switches off the changeover switch 250 (step S947).

Next, the quantizer 150 quantizes a predetermined number of sample values which are frame data (step S944). At that time, the filter adjuster 171 counts the clip count in the quantizer 150 for the quantized frame, and the counted number is set to the clip count Clip_Cnt (step S945). Thereafter, a determination is made as to whether or not there is a next frame to be quantized (step S946). When there is the next frame, the flow returns to S941, and a determination is made as to whether or not the correction filter C(z) 260 will be enabled based on the clip count Clip_Cnt for the previous frame. On the other hand, when there is no next frame, the operation of selectively adding the correction filter C(z) 260 by the filter adjuster 171 ends.

Modified Configuration of Audio Coding Apparatus

Figure 10:
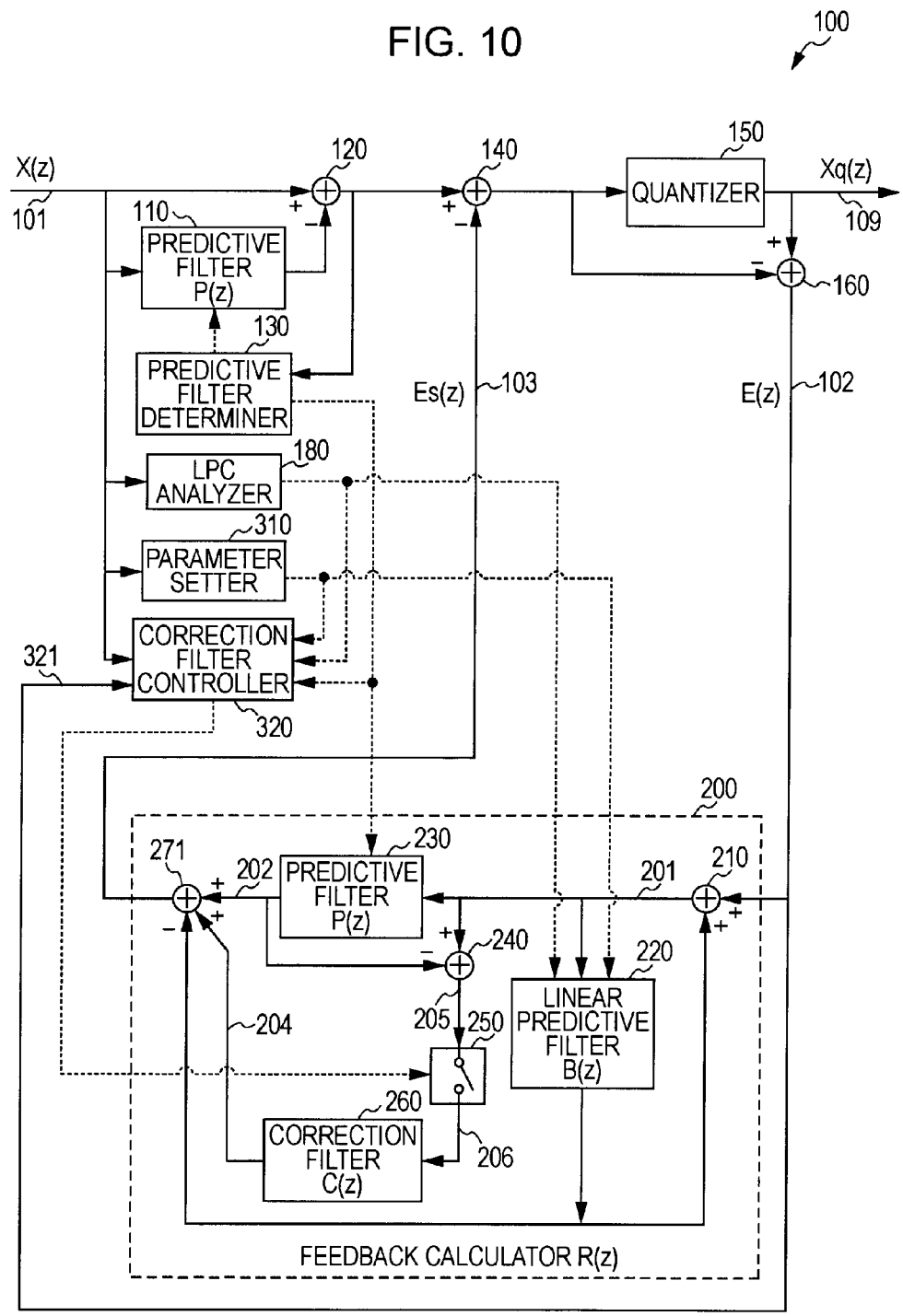
FIG. 10 is a block diagram showing the configuration of the audio coding apparatus according to a modification of the third embodiment of the present invention.

FIG. 10 is a block diagram showing the configuration of the audio coding apparatus 100 according to a modification of the third embodiment of the present invention. The audio coding apparatus 100 shown in FIG. 10 includes a parameter setter 310 and a correction filter controller 320, in lieu of the filter adjuster 170 of the audio coding apparatus 100 shown in FIG. 7. Since the components other than the parameter setter 310 and the correction filter controller 320 are the same as those shown in FIG. 7, they will be denoted by the same reference numerals and will not be described herein.

The parameter setter 310 is configured to set the adjustment parameter λ of the linear predictive filter B(z) 220 based on the spectral peak amplitude of the input audio signal X(z). The spectral peak amplitude as used herein refers to the amplitude component other than the spectral envelope component of the frequency characteristic of the input audio signal. The parameter setter 310 detects the spectral peak amplitude of the input audio signal X(z) for each frame and determines the value of the adjustment parameter λ based on the detected peak amplitude. The parameter setter 310 sets the determined value of the adjustment parameter λ into the linear predictive filter B(z) 220 of the feedback calculator R(z) 200. The parameter setter 310 is an example of the parameter setter as described in the claims.

The correction filter controller 320 is configured to determine whether or not the correction filter C(z) 260 is necessary based on the ratio of the level of the input audio signal X(z) at a predetermined frequency band to the level of the quantization noise after decoding. For example, the correction filter controller 320 calculates the frequency characteristic of the quantization noise after decoding based on Equation 3 using the quantization error signal E(z) generated by the subtractor 160 and the transfer functions of the predictive filter P(z) 110 and the feedback calculator R(z) 200. Moreover, the correction filter controller 320 calculates the frequency characteristic Ey(z) of the quantization noise after decoding, for example, based on the following equation which is derived by substituting Equation 6 into Equation 3.

$$Ey(z)=(1-C(z))/(1-B(z))\cdot E(z)$$

Based on this equation, the correction filter controller 320 calculates the frequency characteristic Ey(z) of the quantization noise after decoding using the transfer functions of the linear predictive filter B(z) 220 and the correction filter C(z) 260 and the quantization error signal E(z). That is to say, the correction filter controller 320 calculates the quantization noise after decoding based on the predictive filter coefficient $b_k$, the adjustment parameter λ, the correction filter coefficient $c_k$, and the quantization error signal E(z). In this example, the frequency characteristic Ey(z) of the quantization noise after decoding is described to be calculated using the quantization error signal E(z) supplied from the signal line 321. However, the calculation may be performed while assuming the quantization error signal E(z) be white noise, namely E(z)=1.

Next, the correction filter controller 320 calculates the S/N which is the ratio of the level (Signal) of the input audio signal X(z) at the low-frequency band to the calculated level (Noise) of the quantization noise at the low-frequency band for each frame. Then, the correction filter controller 320 controls the changeover switch 250 so as to selectively add the correction filter C(z) 260 based on the calculated S/N for each frame.

For example, when the S/N calculated for the immediately previous frame is smaller than a predetermined threshold Tf, the correction filter controller 320 switches on the changeover switch 250, thus enabling the correction filter C(z) 260. On the other hand, when the S/N is equal to or greater than the threshold Tf, the correction filter controller 320 switches off the changeover switch 250, thus disabling the correction filter C(z) 260. The correction filter controller 320 is an example of the correction filter controller as described in the claims.

Exemplary Method for Detecting Spectral Peak Amplitude of Input Audio Signal

Figure 11:
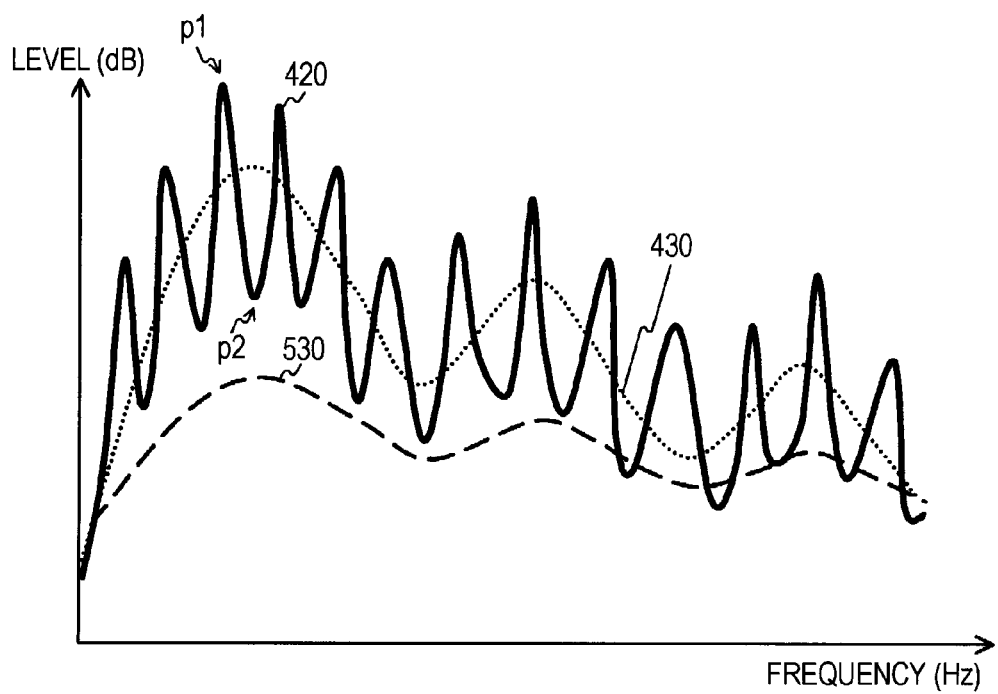
FIG. 11 is a conceptual diagram showing the method for detecting the spectral peak amplitude of an input audio signal by a parameter setter according to a modification of the third embodiment of the present invention.

FIG. 11 is a conceptual diagram showing the method for detecting the spectral peak amplitude of the input audio signal by the parameter setter 310 according to a modification of the third embodiment of the present invention. In the drawing, the frequency characteristic of the input audio signal is represented by the solid line 420, the spectral envelope curve is represented by the dotted line 430, and the frequency characteristic of the quantization noise is represented by the broken line 530. In the drawings, the vertical axis represents level and the horizontal axis represents frequency.

The frequency characteristic 420 of the input audio signal is the frequency characteristic of the input audio signal X(z) input to the audio coding apparatus 100. The frequency characteristic 420 of the input audio signal shows a frequency characteristic having a complex waveform with many peaks (poles). The vibration amplitude of the amplitude components other than the spectral envelope component of the frequency characteristic of the input audio signal, namely the vibration amplitude between neighboring maximum point P1 and minimum point P2, for example, will be referred to as a peak amplitude. This kind of frequency characteristic of the input audio signal appears, for example, in an input audio signal having strong periodic components (pitches).

The spectral envelope curve 430 is the spectral envelope curve of the input audio signal which is generated based on spectral envelope information estimated by the LPC analyzer 180. The spectral envelope curve 430 estimated by the LPC analyzer 180 is generated so as to pass the approximate centers of the peak amplitude (the vibration amplitude between neighboring maximum point and minimum point) of the frequency characteristic 420 of the input audio signal. The frequency characteristic 530 of the quantization noise is the frequency characteristic of the quantization noise after decoding which is modulated by the feedback calculator R(z) 200.

As described above, when the spectral peak amplitude of the input audio signal is large, the frequency characteristic 530 of the quantization noise is modulated based on the spectral envelope curve 430. In such a case, the level of the quantization noise may sometimes exceed the level of the input audio signal in some frequency bands. Therefore, the average of the spectral peak amplitude of the input audio signal, namely the average of the differences between the maximum peak levels P1 and the minimum peak levels P2 is detected, and the adjustment parameter λ is determined based on the detection results. For example, the adjustment parameter λ is set to be smaller as the spectral peak amplitude of the input audio signal increases, whereas the adjustment parameter λ is set to be larger as the spectral peak amplitude decreases. When the spectral peak amplitude of the input audio signal is detected, only the peak amplitude components are extracted by removing the spectral envelope components of the input audio signal based on the spectral envelope information estimated by the LPC analyzer 180. Moreover, based on the extracted peak amplitude components, the spectral peak amplitude of the input audio signal may be detected. In this example, although the adjustment parameter λ is described as being determined using the peak amplitude, the magnitude of the pitch components of the input audio signal obtained by a Cepstrum analysis, the pitch intensity of the input audio signal obtained by a pitch analysis, or the like may be used in lieu of the peak amplitude.

Exemplary Method for Selectively Adding Correction Filter by Filter Adjuster

Figure 12:
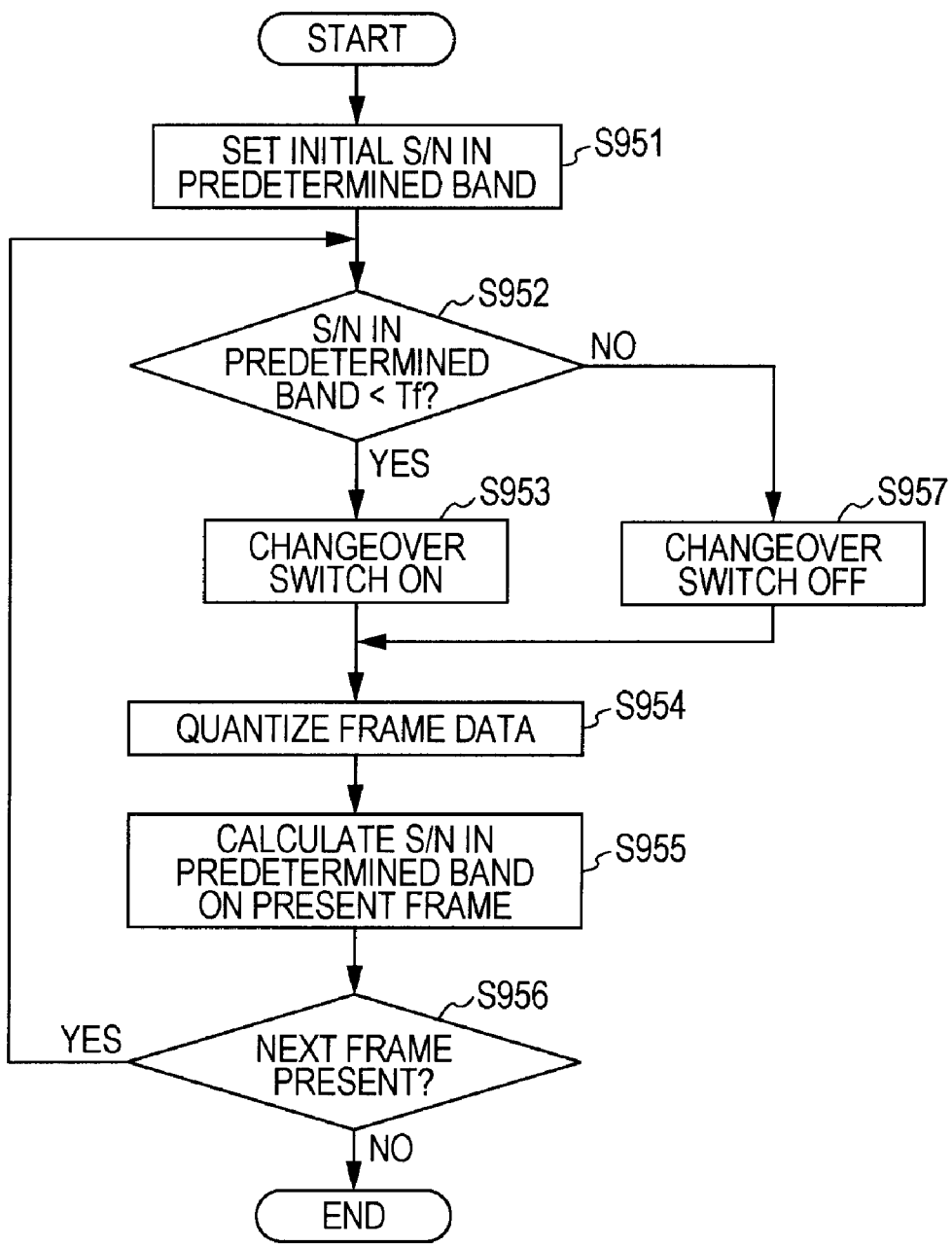
FIG. 12 is a flowchart showing an example of the processing procedures of the method for selectively adding the correction filter C(z) by a correction filter controller according to a modification of the third embodiment of the present invention.
Figure 13A:
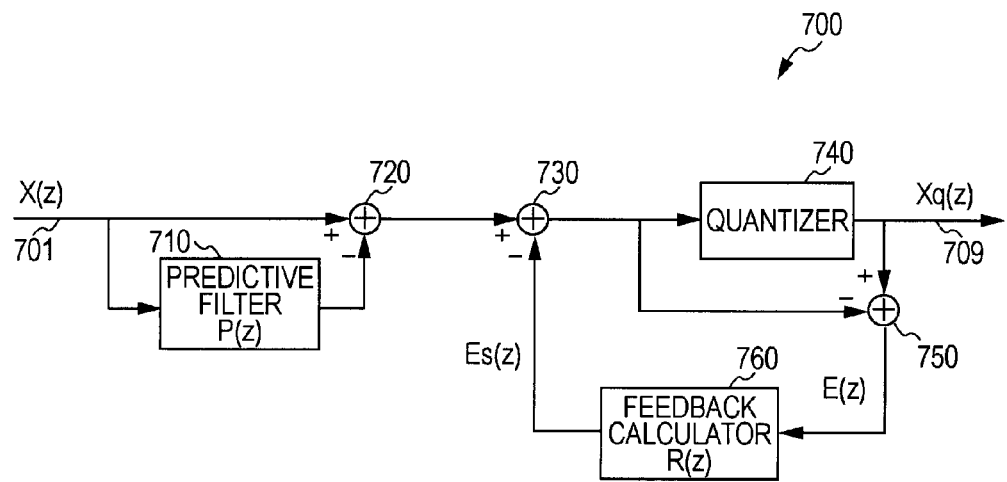
FIGS. 13A and 13B are block diagrams showing one exemplary configuration of an audio transmission system based on ADPCM methods according to the related art.
Figure 13B:
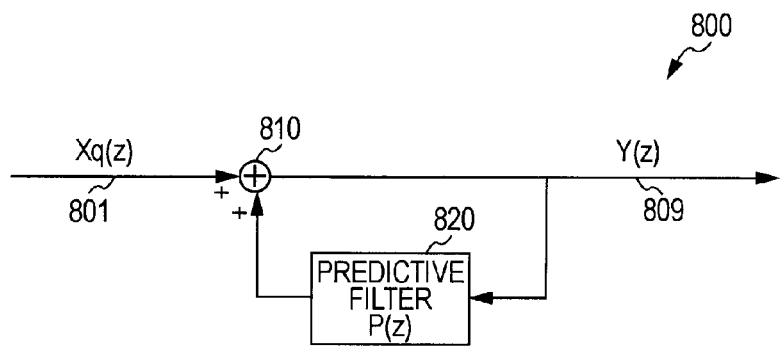
Figure 14:
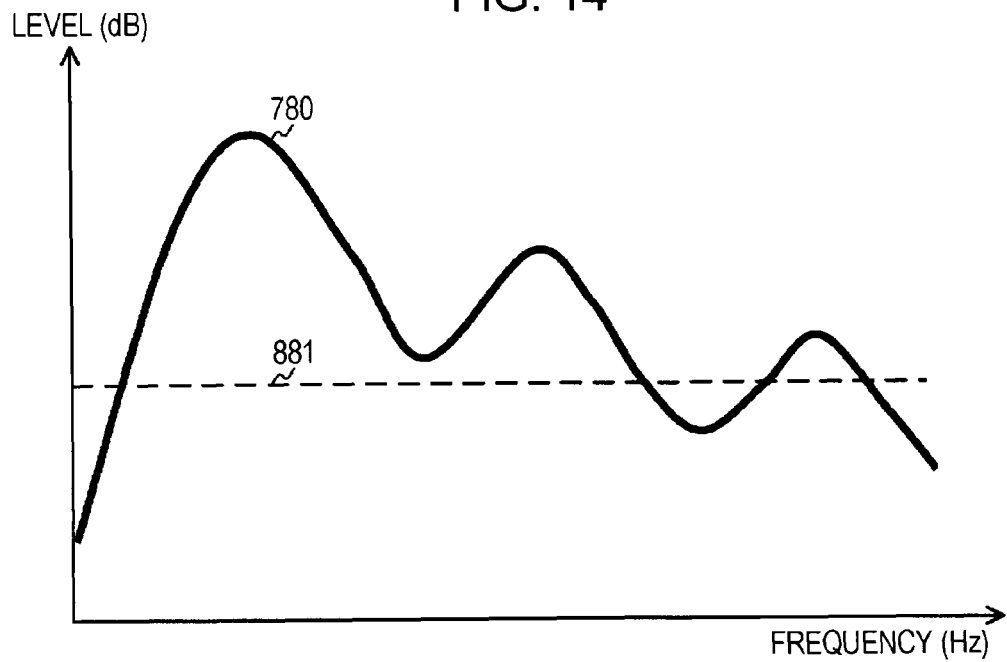
FIG. 14 is a diagram showing an example of the quantization noise output from an audio decoding apparatus in the case of P(z)=R(z)

FIG. 12 is a flowchart showing an example of the processing procedures of the method for selectively adding the correction filter C(z) 260 by the correction filter controller 320 according to a modification of the third embodiment of the present invention.

First, the correction filter controller 320 sets the initial value of the S/N at the low-frequency band (step S951). Next, the correction filter controller 320 makes a determination as to whether or not the value of the S/N at the low-frequency band is equal to or greater than a predetermined threshold Tf (step S952). When the value of the S/N is smaller than the threshold Tf, the correction filter controller 320 switches on the changeover switch 250 (step S953). On the other hand, when the value of the S/N is equal to or greater than the threshold Tf, the correction filter controller 320 switches off the changeover switch 250 (step S957).

Next, the quantizer 150 quantizes a predetermined number of sample values which are frame data (step S954). Subsequently, the correction filter controller 320 calculates the frequency characteristic of the quantization noise at the low-frequency band based on the quantization error signal E(z) generated by the subtractor 160 and the transfer functions of the feedback calculator R(z) 200 and the predictive filter P(z) 110. Alternatively, the correction filter controller 320 calculates the frequency characteristic of the quantization noise at the low-frequency band based on the quantization error signal E(z) generated by the subtractor 160 and the transfer functions of the linear predictive filter B(z) 220 and the correction filter C(z) 260. In this way, the correction filter controller 320 calculates the value of the S/N which is the ratio of the level of the input audio signal to the calculated level of the quantization noise (step S955).

Thereafter, a determination is made as to whether or not there is a next frame to be quantized (step S956). When there is the next frame, the flow returns to S951, and a determination is made as to whether or not the correction filter C(z) 260 will be enabled based on the value of the S/N for the previous frame. On the other hand, when there is no next frame, the operation of selectively adding the correction filter C(z) 260 by the correction filter controller 320 ends.

As described above, according to the modification of the third embodiment of the present invention, the parameter setter 310 enables setting the adjustment parameter λ based on the peak amplitude of the frequency characteristic of the input audio signal. Moreover, the correction filter controller 320 enables the appropriate determination of the necessity of the correction filter C(z) 260 based on the value of the S/N at the low-frequency band.

According to the embodiment of the present invention, the linear predictive filter B(z) 220 and the correction filter C(z) 260 which are configured by the all-pole filter and provided to the feedback calculator R(z) 200 enable the appropriate control of the quantization noise after decoding. In this way, deterioration in the audio quality due to coding can be reduced.

Although the embodiments of the present invention have been described with respect to the control of the frequency characteristic of the quantization noise in the audio coding apparatus 100, the present invention can be applied to an acoustic coding apparatus and an information coding apparatus.

The embodiments of the present invention are shown as an example for implementing the present invention, and correspondingly relate to the invention specifying matters in the claims as described above. However, the present invention is not limited to the embodiments, and various modifications can be made in the range without departing from the subject matter of the present invention.

In addition, the processing procedures described in the embodiments of the present invention may be grasped as methods including the series of procedures. Moreover, the series of procedures may be grasped as the programs for making a computer execute the series of the procedures, or a recording medium storing the programs. As the recording medium, a CD (compact disc), a MD (MiniDisc), a DVD (digital versatile disc), a memory card, a blu-ray disc (the registered trademark), and the like may be used.

The present application contains subject matter related to that disclosed in Japanese Priority Patent Application JP 2008-320779 filed in the Japan Patent Office on Dec. 17, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An information coding apparatus comprising:
   a predictive signal generator that generates a predictive signal based on a past audio signal in an input audio signal and a predictive filter coefficient for predicting a present audio signal;
   a predictive residual signal generator that generates a difference between the present audio signal and the predictive signal as a predictive residual signal;
   a quantizer that quantizes a quantization input signal generated based on the predictive residual signal to generate a quantization output signal;
   a quantization error signal generator that generates a difference between the quantization input signal and the quantization output signal as a quantization error signal;
   a feedback signal generator that generates a feedback signal for controlling a frequency characteristic of a quantization noise after decoding based on the quantization error signal;
   a filter adjuster that performs control to selectively add correction filters for frames of the present audio signal based on a clipping frequency of the quantizer; and
   a quantization input signal generator that generates a difference between the predictive residual signal and the feedback signal as the quantization input signal,
   wherein the feedback signal generator is configured by a pole-zero filter that includes a filter coefficient of an all-pole filter which is based on spectral envelope information estimated by the input audio signal, a parameter for adjusting a peak level in the frequency characteristic of the quantization noise caused by the all-pole filter, and the predictive filter coefficient.

2. The information coding apparatus according to claim 1, wherein the feedback signal generator is configured by the pole-zero filter that further includes a filter coefficient of a correction filter for decreasing the level of the quantization noise at a predetermined frequency band.

3. The information coding apparatus according to claim 2, wherein the feedback signal generator further includes a changeover switch that selectively adds the correction filter based on the control of the filter adjuster.

4. The information coding apparatus according to claim 1, further comprising a parameter setter that sets the value of the parameter into the feedback signal generator for each frame based on a clipping frequency of the quantizer for each frame.

5. The information coding apparatus according to claim 1, further comprising a parameter setter that detects a spectral peak amplitude of the input audio signal for each frame and sets the value of the parameter into the feedback signal generator for each frame based on the detected peak amplitude.

6. The information coding apparatus according to claim 1, further comprising a linear predictive analyzer that supplies a linear predictive filter coefficient calculated based on spectral envelope information by a linear predictive analysis to the feedback signal generator as the filter coefficient of the all-pole filter.

7. An information coding apparatus comprising:
a predictive signal generator that generates a predictive signal based on a past audio signal in an input audio signal and a predictive filter coefficient for predicting a present audio signal;
a predictive residual signal generator that generates a difference between the present audio signal and the predictive signal as a predictive residual signal;
a quantizer that quantizes a quantization input signal generated based on the predictive residual signal to generate a quantization output signal;
a quantization error signal generator that generates a difference between the quantization input signal and the quantization output signal as a quantization error signal;
a feedback signal generator that generates a feedback signal for controlling a frequency characteristic of a quantization noise after decoding based on the quantization error signal;
a correction filter controller that calculates the quantization noise using the quantization error signal and a transfer function of the feedback signal generator and performs control so as to selectively add correction filters for frames of the present audio signal based on a calculation; and
a quantization input signal generator that generates a difference between the predictive residual signal and the feedback signal as the quantization input signal,
wherein the feedback signal generator is configured by a pole-zero filter that includes a filter coefficient of an all-pole filter which is based on spectral envelope information estimated by the input audio signal, a parameter for adjusting a peak level in the frequency characteristic of the quantization noise caused by the all-pole filter, and the predictive filter coefficient.

8. The information coding apparatus of claim 7, wherein the feedback signal generator is configured by the pole-zero filter that further includes a filter coefficient of a correction filter for decreasing the level of the quantization noise at a predetermined frequency band.

9. The information coding apparatus of claim 7, wherein the calculation is based on a ratio of the level of the input audio signal to the level of the quantization noise for each frame.

10. The information coding apparatus according to claim 7, further comprising a parameter setter that detects a spectral peak amplitude of the input audio signal for each frame and sets the value of the parameter into the feedback signal generator for each frame based on the detected peak amplitude.

11. The information coding apparatus according to claim 7, further comprising a linear predictive analyzer that supplies a linear predictive filter coefficient calculated based on spectral envelope information by a linear predictive analysis to the feedback signal generator as the filter coefficient of the all-pole filter.

* * * * *